(12) United States Patent
Yoshimura et al.

(10) Patent No.: US 6,669,801 B2
(45) Date of Patent: Dec. 30, 2003

(54) DEVICE TRANSFER METHOD

(75) Inventors: Tetsuzo Yoshimura, Tokyo (JP); James Roman, Sunnyvale, CA (US); Wen-chou Vincent Wang, Cupertino, CA (US); Masaaki Inao, Machida (JP); Mark Thomas McCormack, Livermore, CA (US)

(73) Assignee: Fujitsu Limited, Kawasaki (JP)

( * ) Notice: Subject to any disclaimer, the term of this patent is extended or adjusted under 35 U.S.C. 154(b) by 10 days.

(21) Appl. No.: 09/853,353

(22) Filed: May 9, 2001

(65) Prior Publication Data

US 2002/0036055 A1 Mar. 28, 2002

Related U.S. Application Data

(63) Continuation-in-part of application No. 09/489,294, filed on Jan. 21, 2000, now abandoned.

(51) Int. Cl.⁷ ............................................ B32B 31/00
(52) U.S. Cl. ...................... 156/230; 156/235; 156/289; 156/297
(58) Field of Search ................................ 156/230, 235, 156/289, 297, 234

(56) References Cited

U.S. PATENT DOCUMENTS

| | | | |
|---|---|---|---|
| 3,529,759 A | 9/1970 | Clark | |
| 4,007,978 A | 2/1977 | Holton | 350/96 |
| 4,112,196 A | 9/1978 | Selig et al. | 428/594 |
| 4,114,257 A | 9/1978 | Bellavance | 29/572 |
| 4,126,758 A | 11/1978 | Krumme | 174/52 |
| 4,240,849 A | 12/1980 | Kurokawa et al. | 156/73.2 |
| 4,609,252 A | 9/1986 | Wong et al. | 350/96.12 |
| 4,630,883 A | 12/1986 | Taylor et al. | 350/96.15 |
| 4,749,245 A | 6/1988 | Kawatsuki et al. | 350/96.12 |
| 4,750,799 A | 6/1988 | Kawachi et al. | 350/96.11 |
| 4,755,866 A | 7/1988 | Marshall et al. | 357/81 |
| 4,762,381 A | 8/1988 | Uemiya et al. | 350/96.11 |
| 4,776,661 A | 10/1988 | Handa | 350/96.19 |
| 4,787,691 A | 11/1988 | Lorenzo et al. | 350/96.14 |
| 4,805,038 A | 2/1989 | Seligson | |
| 4,846,931 A | 7/1989 | Gmitter et al. | 156/633 |
| 4,871,224 A | 10/1989 | Karstensen et al. | 350/96.15 |
| 4,883,561 A * | 11/1989 | Gmitter et al. | |
| 4,892,374 A | 1/1990 | Ackerman et al. | |
| 4,941,255 A | 7/1990 | Bull | 29/833 |
| 4,969,712 A | 11/1990 | Westwood et al. | |
| 5,009,476 A | 4/1991 | Reid et al. | 359/96.11 |
| 5,011,550 A | 4/1991 | Konushi et al. | 148/33.5 |
| 5,054,870 A | 10/1991 | Losch et al. | 385/14 |
| 5,054,872 A | 10/1991 | Fan et al. | 385/130 |
| 5,059,475 A | 10/1991 | Sun et al. | 428/195 |
| 5,061,028 A | 10/1991 | Khanarian et al. | 385/132 |
| 5,073,230 A | 12/1991 | Maracas | 156/631 |
| 5,104,771 A | 4/1992 | Murray et al. | 430/290 |
| 5,159,700 A | 10/1992 | Reid et al. | 385/14 |
| 5,170,448 A | 12/1992 | Ackley et al. | 385/31 |
| 5,179,601 A | 1/1993 | Gotoh et al. | 385/14 |
| 5,192,716 A | 3/1993 | Jacobs | 437/209 |
| 5,194,548 A | 3/1993 | Yoshimura | 526/285 |
| 5,201,996 A * | 4/1993 | Gmitter et al. | |
| 5,208,879 A | 5/1993 | Gallo et al. | 385/14 |
| 5,208,892 A | 5/1993 | Burack et al. | 385/129 |
| 5,219,710 A | 6/1993 | Horn et al. | 430/270 |
| 5,219,787 A | 6/1993 | Carey et al. | 437/187 |
| 5,220,628 A | 6/1993 | Delbare et al. | |
| 5,237,434 A | 8/1993 | Feldman et al. | 359/19 |
| 5,247,593 A | 9/1993 | Lin et al. | 385/17 |
| 5,249,245 A | 9/1993 | Lebby et al. | 385/89 |
| 5,262,351 A | 11/1993 | Bureau et al. | 437/183 |
| 5,263,111 A | 11/1993 | Nurse et al. | 385/130 |
| 5,268,973 A | 12/1993 | Jenevein | 385/74 |
| 5,291,567 A | 3/1994 | Revelli et al. | |
| 5,317,657 A | 5/1994 | Gallo et al. | 385/14 |
| 5,332,690 A | 7/1994 | Cho et al. | 437/126 |
| 5,352,566 A | 10/1994 | Springer et al. | 430/321 |
| 5,358,896 A | 10/1994 | Komatsu et al. | 437/89 |
| 5,371,818 A | 12/1994 | Presby | 385/49 |
| 5,375,184 A | 12/1994 | Sullivan | 385/129 |
| 5,376,229 A | 12/1994 | Miller et al. | 156/651 |

(List continued on next page.)

FOREIGN PATENT DOCUMENTS

| | | |
|---|---|---|
| EP | 0 617 314 A1 | 9/1993 |
| EP | 0 689 067 A2 | 6/1995 |
| JP | 7-077637 A | 3/1995 |
| JP | 8-007626 A | 1/1996 |
| JP | 8-008389 A | 1/1996 |
| JP | 8-065251 A | 3/1996 |
| JP | 8-069024 A | 3/1996 |
| JP | 8-253758 A | 10/1996 |
| JP | 8-262246 A | 10/1996 |
| JP | 8-262265 A | 10/1996 |
| JP | 8-320422 A | 12/1996 |
| JP | 9-157352 A | 4/1997 |
| JP | 9-0090153 A | 6/1997 |

OTHER PUBLICATIONS

G. D. Boyd, et al., "Directional Reactive Ion Etching at Oblique Angles," Applied Physics Letters vol. 36, No. 7, pp. 583–585, Apr. 1, 1980.

(List continued on next page.)

Primary Examiner—Curtis Mayes
(74) Attorney, Agent, or Firm—Sheppard Mullin Richter & Hampton LLP

(57) ABSTRACT

A method for transferring devices to a device substrate is disclosed. In one embodiment, the method includes providing an array of devices on a carrier substrate having a generally horizontal surface, where the array comprises multiple device pluralities. The method includes tilting the device pluralities with respect to the generally horizontal surface of the carrier substrate. Each tilted device plurality is preferably in substantially the same pattern, and each tilted device plurality is placed on device regions on respective device substrates.

67 Claims, 18 Drawing Sheets

U.S. PATENT DOCUMENTS

| | | | |
|---|---|---|---|
| 5,394,490 A | 2/1995 | Kato et al. | 385/14 |
| 5,401,983 A | 3/1995 | Jokerst et al. | 257/82 |
| 5,416,861 A | 5/1995 | Koh et al. | 385/14 |
| 5,428,698 A | 6/1995 | Jenkins et al. | 385/27 |
| 5,444,811 A | 8/1995 | Yoshimura et al. | 385/141 |
| 5,455,202 A | 10/1995 | Malloy et al. | 437/228 |
| 5,459,232 A | 10/1995 | Sotoyama et al. | 528/353 |
| 5,465,860 A | 11/1995 | Fujimoto et al. | 216/24 |
| 5,469,518 A | 11/1995 | Song et al. | 385/89 |
| 5,488,682 A | 1/1996 | Sauter et al. | 385/53 |
| 5,500,540 A | 3/1996 | Jewell et al. | 257/82 |
| 5,513,021 A | 4/1996 | Kaneshiro et al. | 359/15 |
| 5,513,283 A | 4/1996 | Whang et al. | 385/8 |
| 5,521,992 A | 5/1996 | Chun et al. | 385/14 |
| 5,525,190 A | 6/1996 | Wojnarowski et al. | 358/133 |
| 5,534,466 A | 7/1996 | Perfecto et al. | 437/208 |
| 5,541,039 A | 7/1996 | McFarland et al. | 430/290 |
| 5,546,480 A | 8/1996 | Leonard | 385/3 |
| 5,555,326 A | 9/1996 | Hwang et al. | 385/2 |
| 5,561,733 A | 10/1996 | Ermer et al. | 385/143 |
| 5,562,838 A | 10/1996 | Wojnarowski et al. | 216/24 |
| 5,568,574 A | 10/1996 | Tanguay, Jr. et al. | 385/14 |
| 5,581,646 A | 12/1996 | Tsukamoto et al. | 385/96 |
| 5,593,917 A | 1/1997 | Nuyen | 437/86 |
| 5,594,093 A | 1/1997 | Sotoyama et al. | 528/353 |
| 5,611,008 A | 3/1997 | Yap | 385/14 |
| 5,621,837 A | 4/1997 | Yamada et al. | 385/88 |
| 5,638,469 A | 6/1997 | Feldman et al. | 385/14 |
| 5,652,811 A | 7/1997 | Cook et al. | 385/14 |
| 5,658,966 A | 8/1997 | Tsukamoto et al. | 522/99 |
| 5,659,648 A | 8/1997 | Knapp et al. | 385/129 |
| 5,665,648 A | 9/1997 | Little | 438/117 |
| 5,708,178 A | 1/1998 | Ermer et al. | 546/276.7 |
| 5,723,176 A | 3/1998 | Keyworth et al. | 427/163.2 |
| 5,744,379 A | 4/1998 | Mandai et al. | 437/208 |
| 5,751,867 A | 5/1998 | Schaffner et al. | 385/3 |
| 5,757,445 A | 5/1998 | Vu et al. | 349/45 |
| 5,757,989 A | 5/1998 | Yoshimura et al. | 358/14 |
| 5,761,350 A | 6/1998 | Koh | 385/14 |
| 5,764,820 A | 6/1998 | De Dobbelaere et al. | 385/14 |
| 5,770,466 A | 6/1998 | Sasaki et al. | 437/89 |
| 5,770,851 A | 6/1998 | Park et al. | 250/208.1 |
| 5,796,883 A | 8/1998 | Hamamoto et al. | 358/14 |
| 5,801,439 A | 9/1998 | Fujisawa et al. | |
| 5,817,541 A | 10/1998 | Averkiou et al. | 438/107 |
| 5,818,983 A | 10/1998 | Yoshimura et al. | 385/14 |
| 5,824,595 A | 10/1998 | Igel et al. | 438/464 |
| 5,835,646 A | 11/1998 | Yoshimura et al. | 385/14 |
| 5,854,868 A | 12/1998 | Yoshimura et al. | 385/50 |
| 5,858,814 A | 1/1999 | Goosen et al. | 438/107 |
| 5,863,809 A | 1/1999 | Koren | 438/22 |
| 5,902,715 A | 5/1999 | Tsukamoto et al. | 430/290 |
| 5,917,980 A | 6/1999 | Yoshimura et al. | 385/129 |
| 5,980,831 A | 11/1999 | Braiman et al. | |
| 6,017,681 A | 1/2000 | Tsukamoto et al. | |
| 6,031,945 A | 2/2000 | You et al. | |
| 6,054,761 A | 4/2000 | McCormack et al. | |
| 6,091,879 A | 7/2000 | Chan et al. | |
| 6,101,371 A | 8/2000 | Barber et al. | 455/73 |
| 6,163,957 A | 12/2000 | Jiang et al. | |
| 6,229,947 B1 | 5/2001 | Vawter et al. | |

OTHER PUBLICATIONS

Chang, Yablonovitch, et al., "Vapor Phase Epitaxial Liftoff Process of GaAs", Paper H10.1 of Session H10 of the Fall 1997 Materials Research Symposium, Abstract and private manuscript, 1997.

Norio Murata, "Adhesives for Optical Devices", the $48^{th}$ conference of the Electronic Components and Technology Conference (ECTC), pp. 1178–1185, Seattle, May 25–28, 1998.

Jianhua Gan, et al., "Integration of 45–degree Micro–couplers in Guided–wave Optical Clock Distribution System for Supercomputer," 1998 International Symposium on Microelectronics, San Diego, USA, Nov. 1, 1998, pp. 359–363.

Yoshimura, et al., "Optoelectronic Amplifier/Driver–Less Substrate, OE–ADLES. For Polymer–Waveguide–Based Board Level Interconnection–Calculation Of Delay And Power Dissipation," the 8th Iketani Conference, $4^{th}$ International Conference On Organic Nonlinear Optics (ICONO'4), Oct. 12, 1998, Chitose, Hokkaido, Japan.

"Optoelectronic Scalable Substrates based on Film/Z–connection and its application to Film Optical Link Module (FOLM)", Yohimura et al., Fujitsu Computer Packaging Technologies, Inc.

"Lighting the Way in Computer Design," Circuits & Devices, Jan. 1998, © 1998 IEEE, pp. 23–30.

* cited by examiner

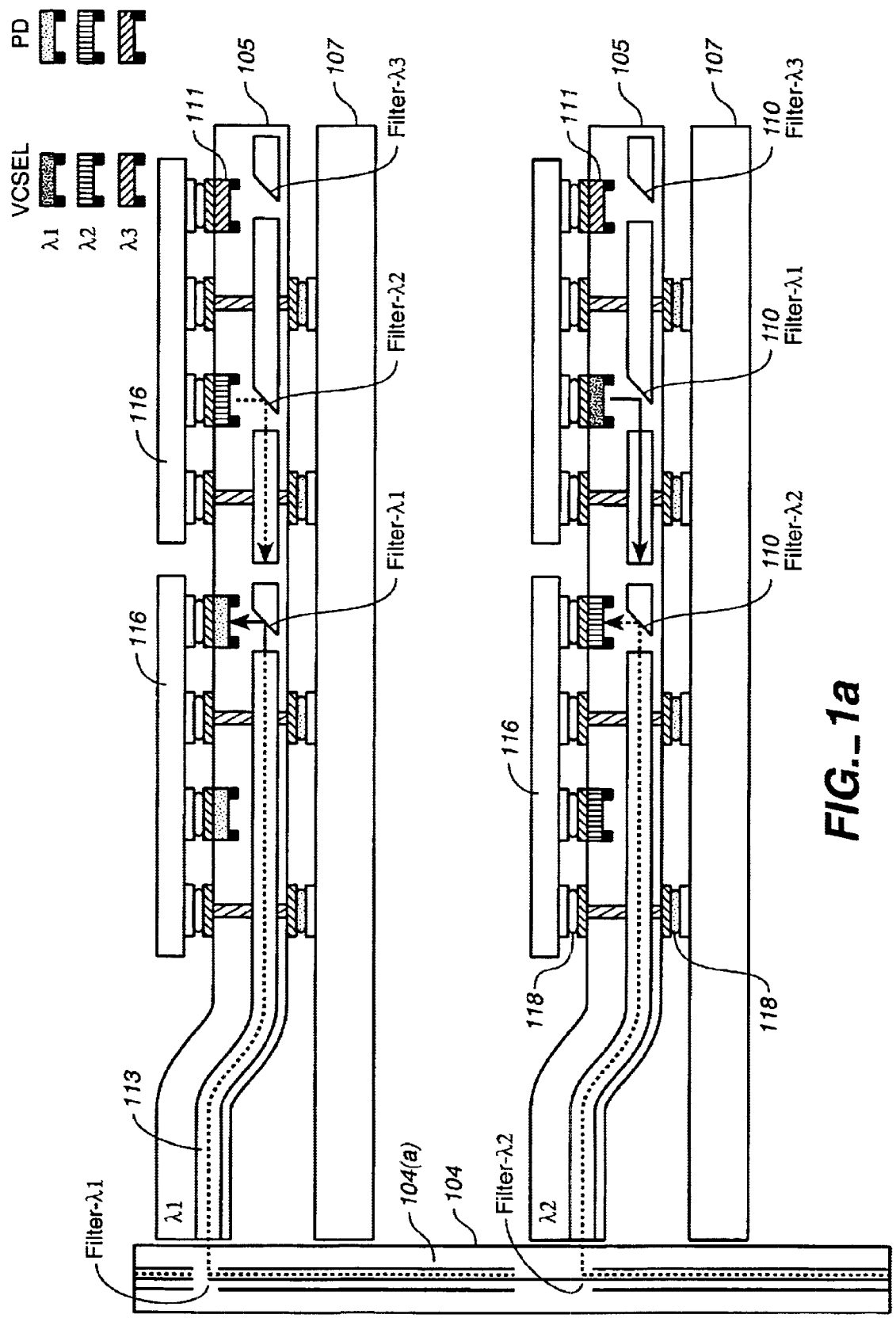
FIG._1a

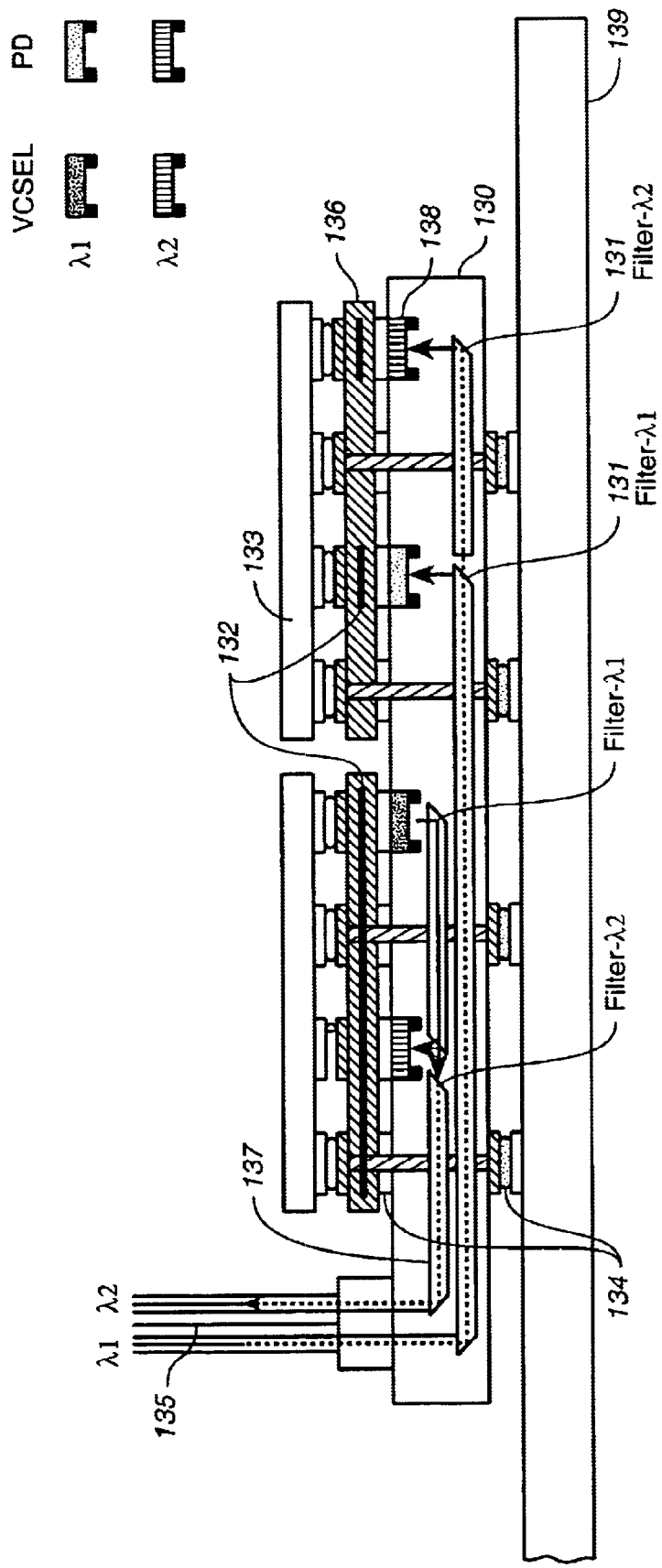

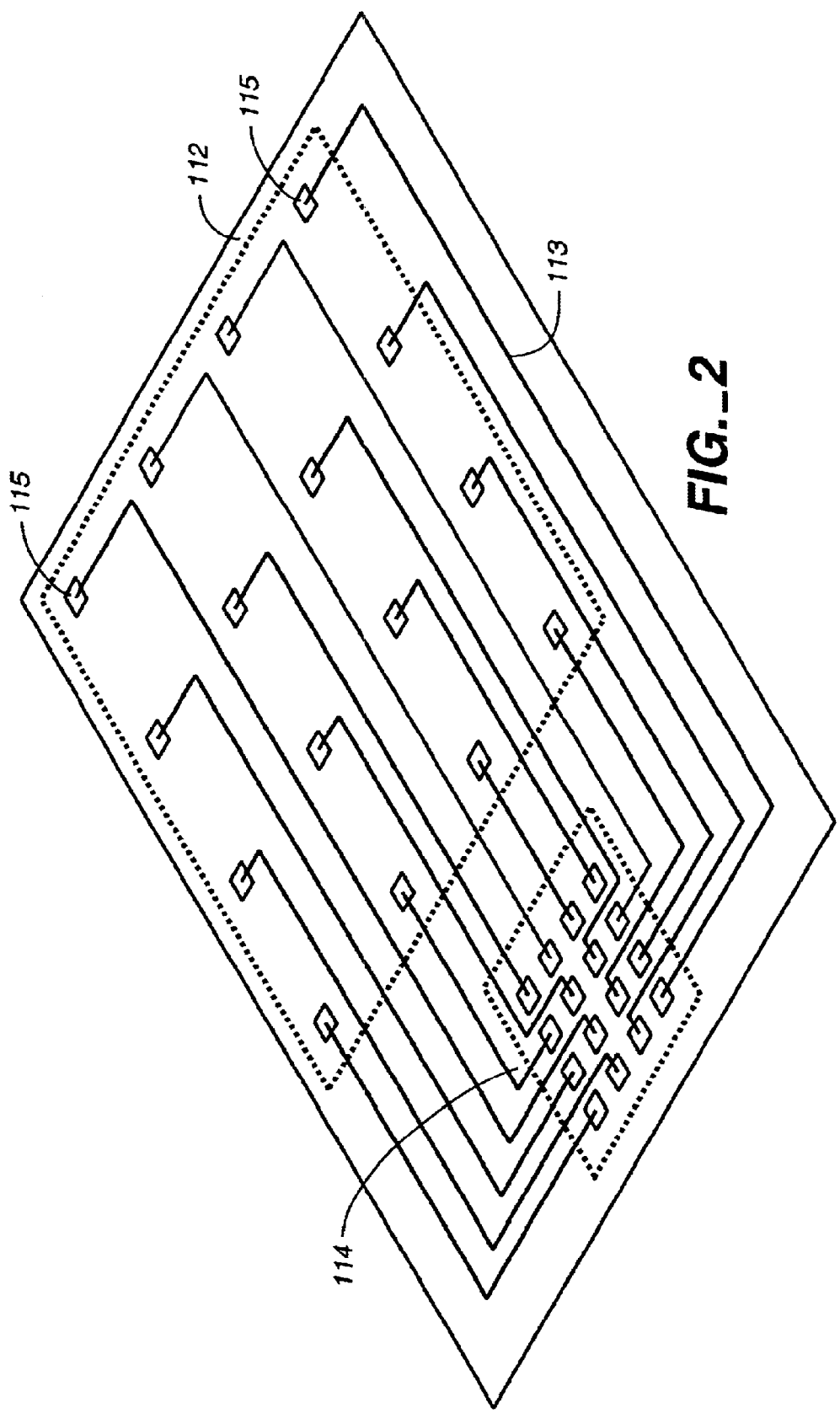
FIG._2

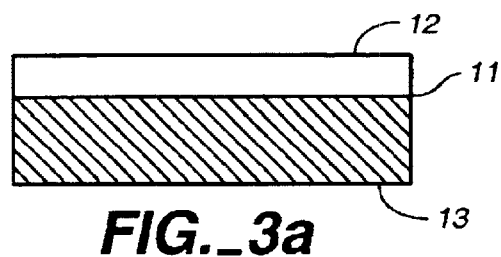
FIG._3a
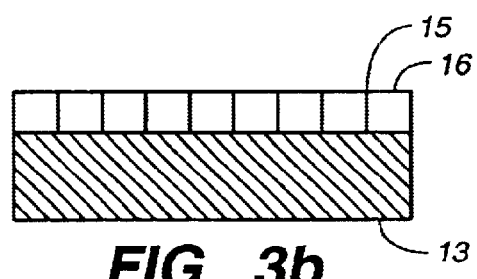
FIG._3b
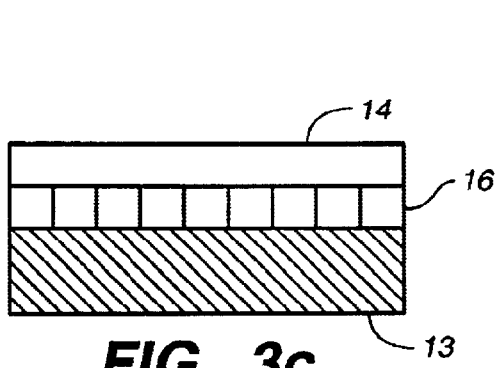
FIG._3c
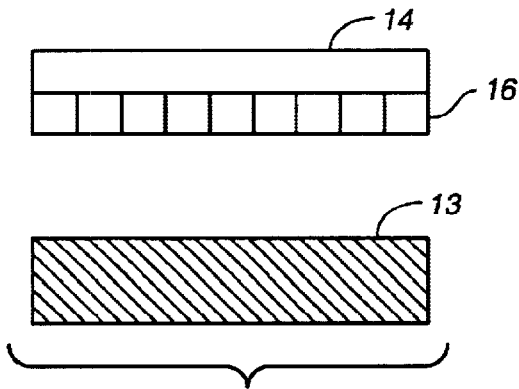
FIG._3d

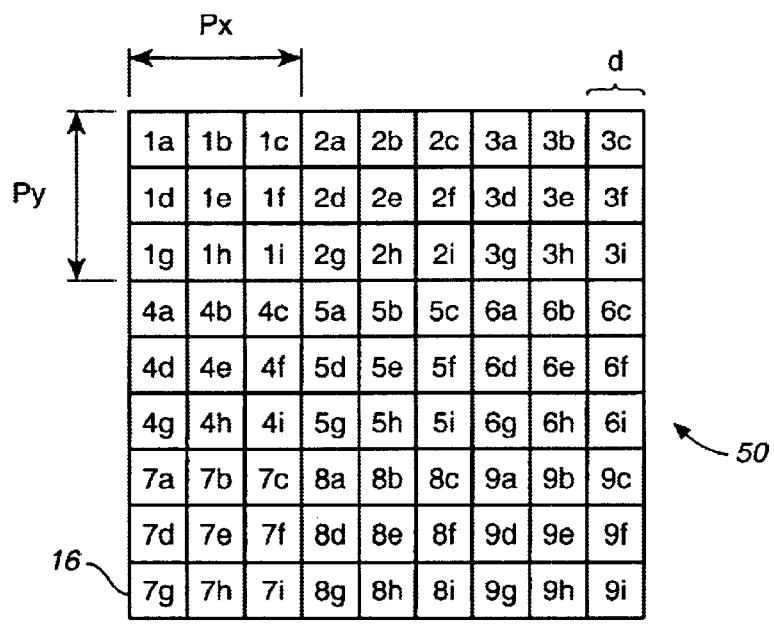
FIG._3e
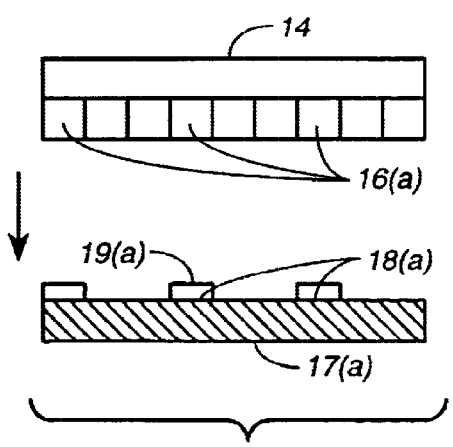
FIG._3f
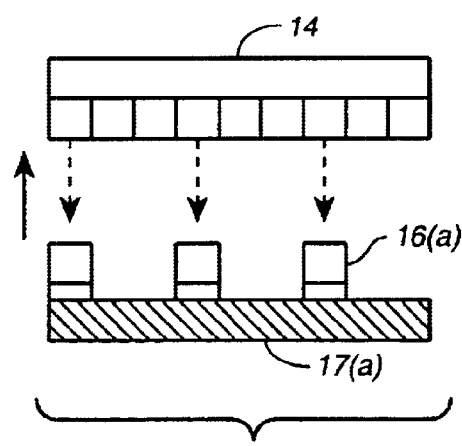
FIG._3g

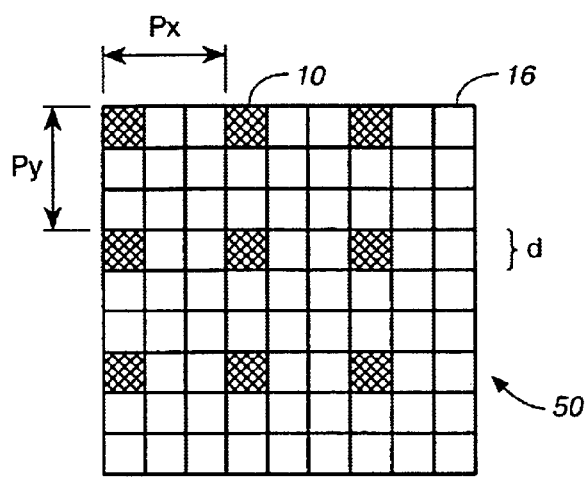
FIG._3h
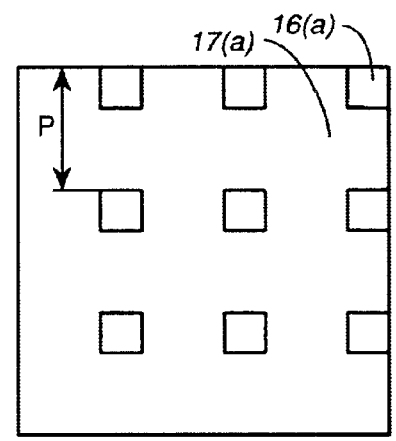
FIG._3i
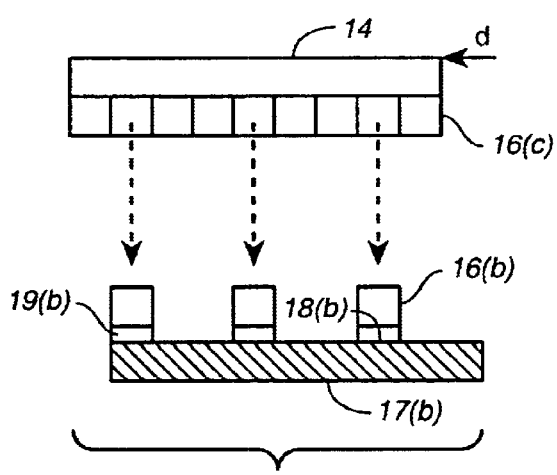
FIG._3j
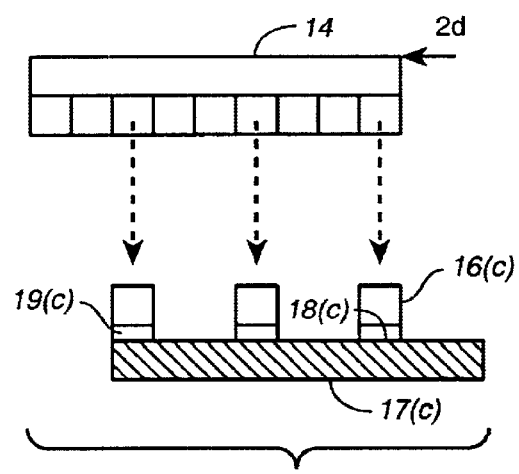
FIG._3k

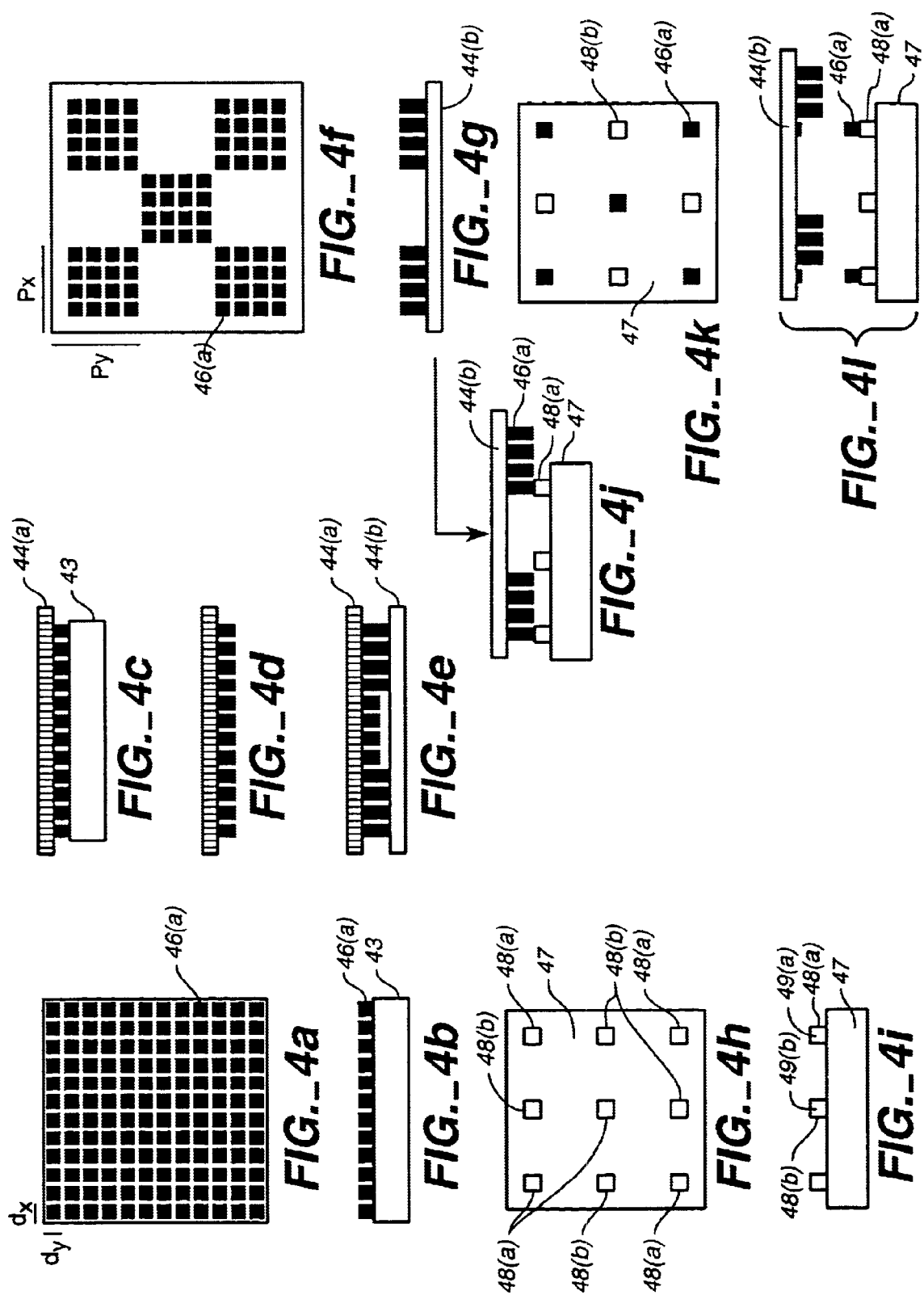

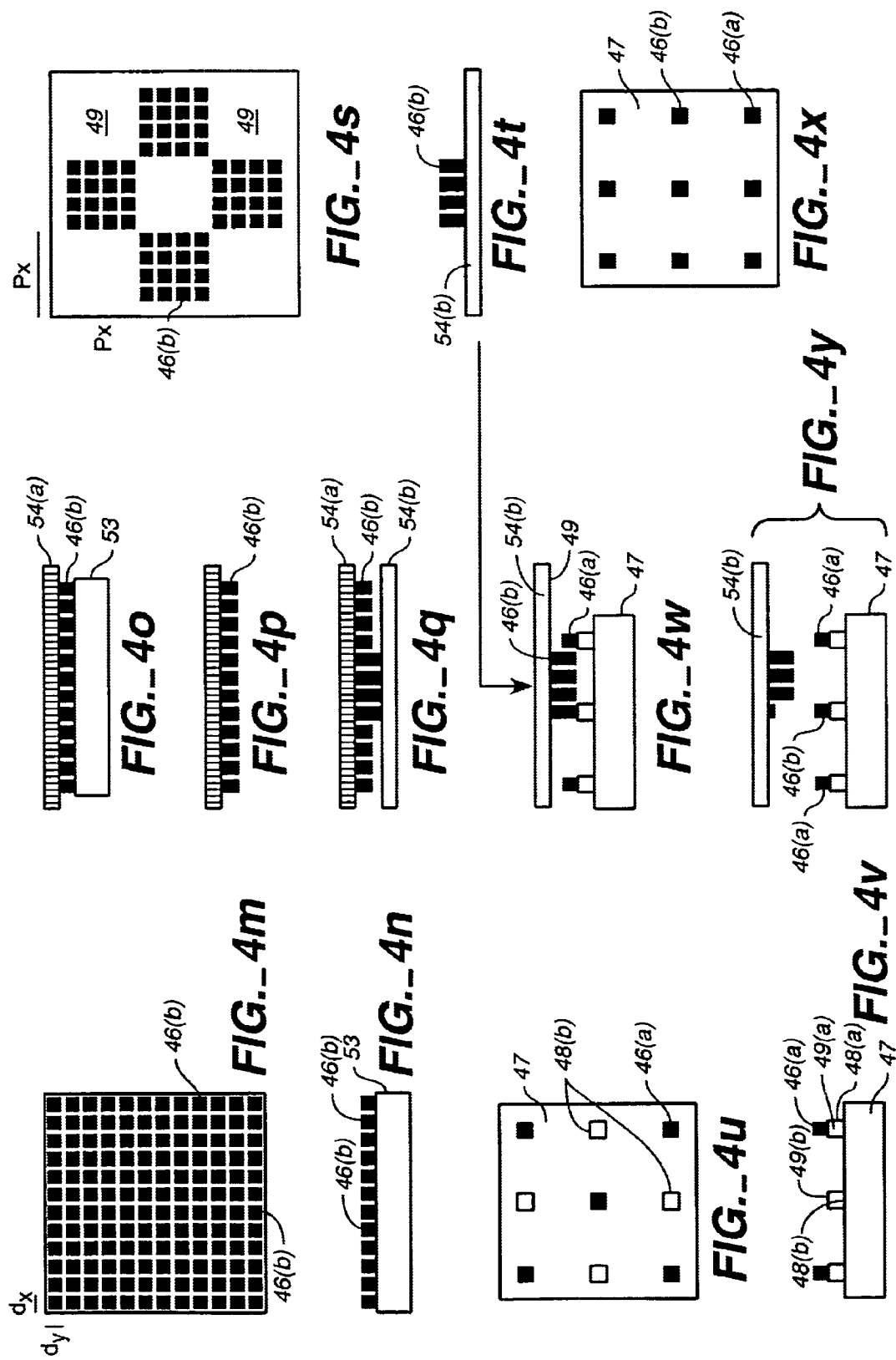

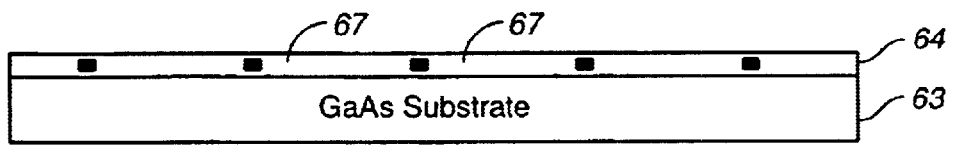
FIG._5a
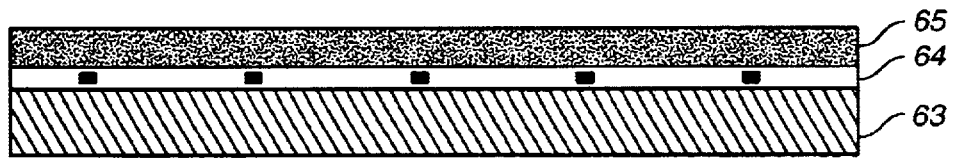
FIG._5b
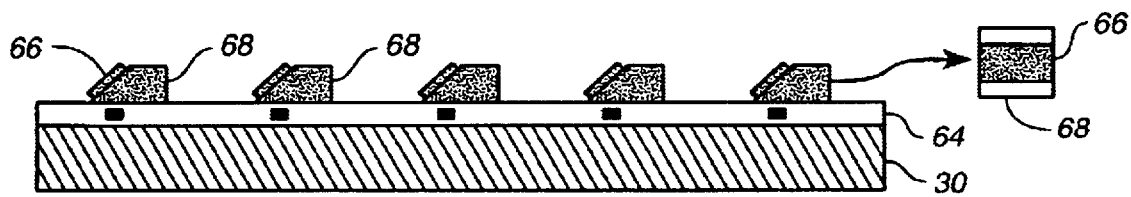
FIG._5c
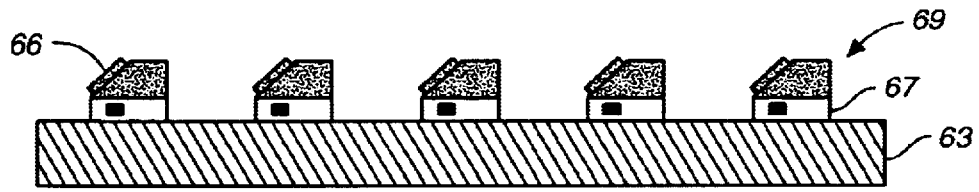
FIG._5d
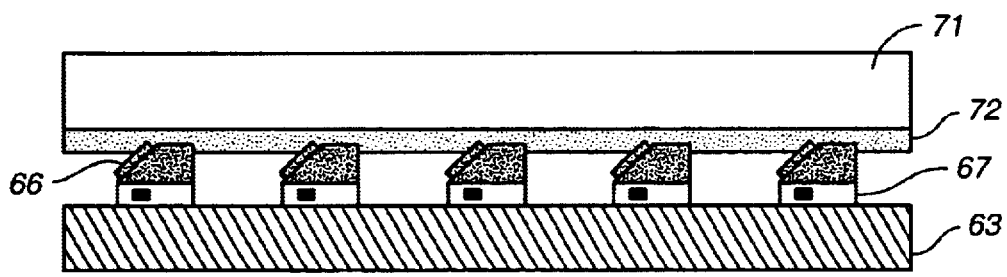
FIG._5e

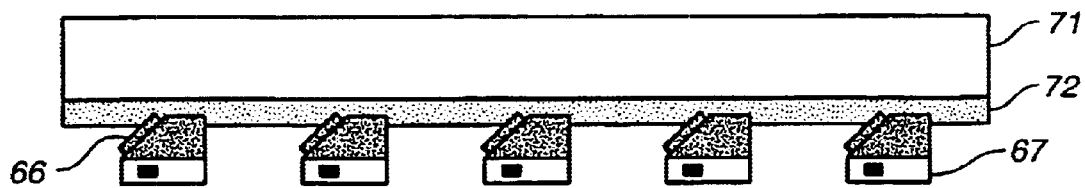
FIG._5f
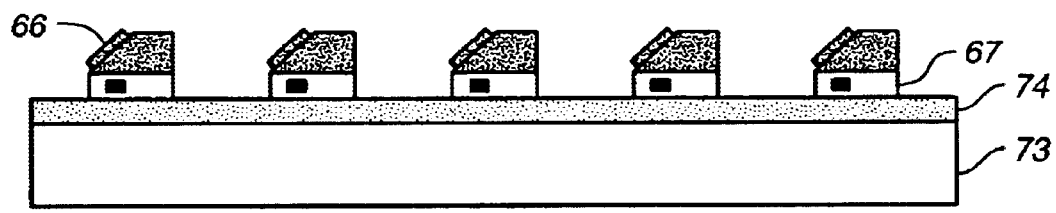
FIG._5g
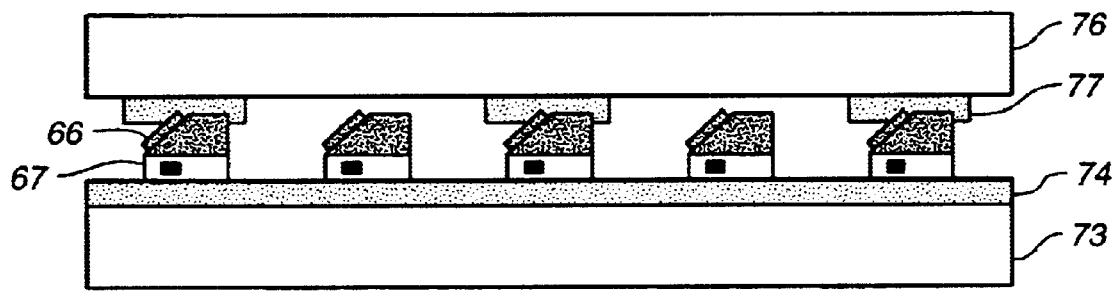
FIG._5h
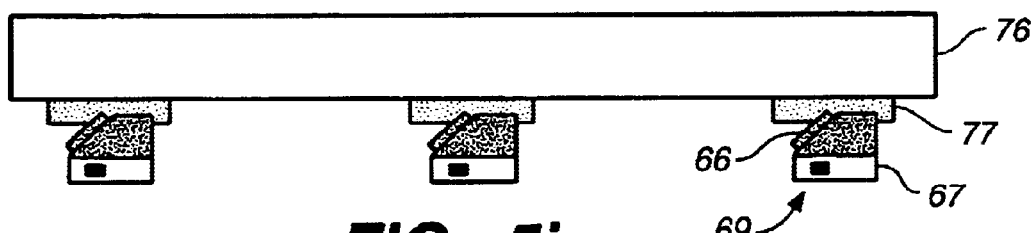
FIG._5i

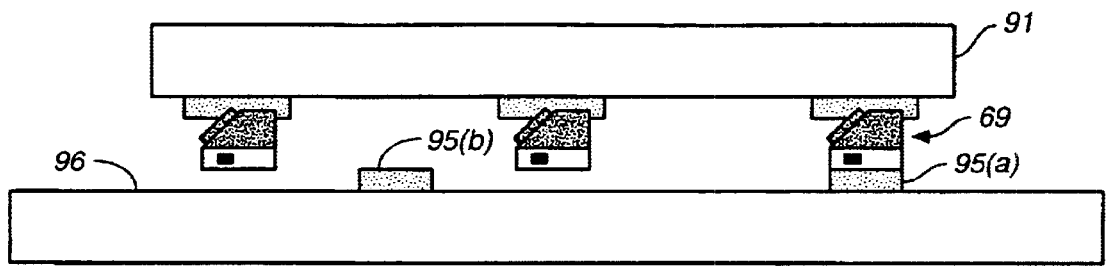
FIG._5j
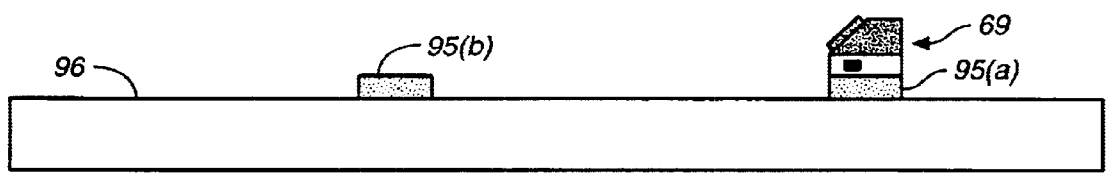
FIG._5k
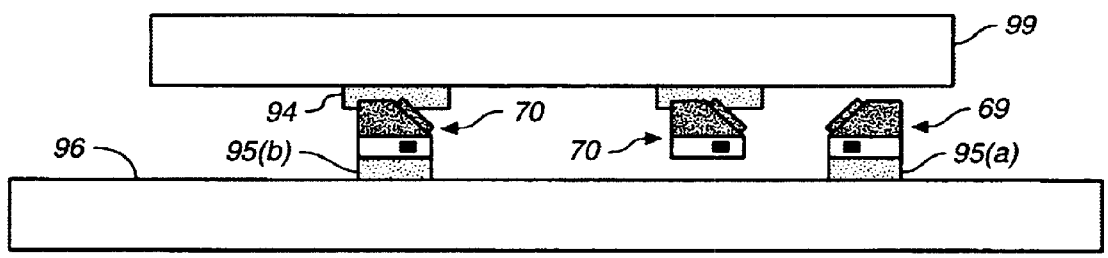
FIG._5l
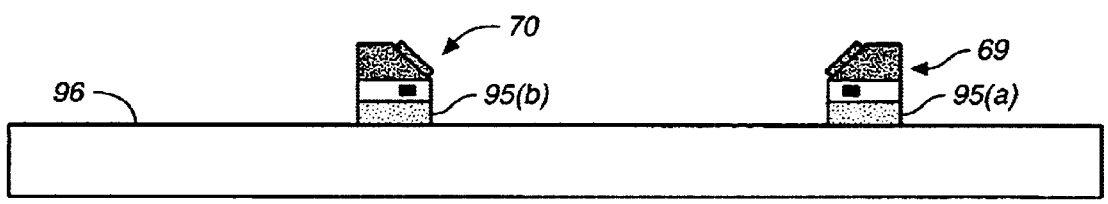
FIG._5m

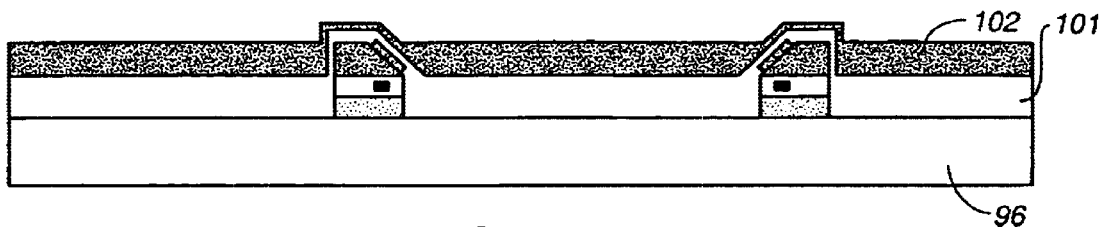
FIG._5n
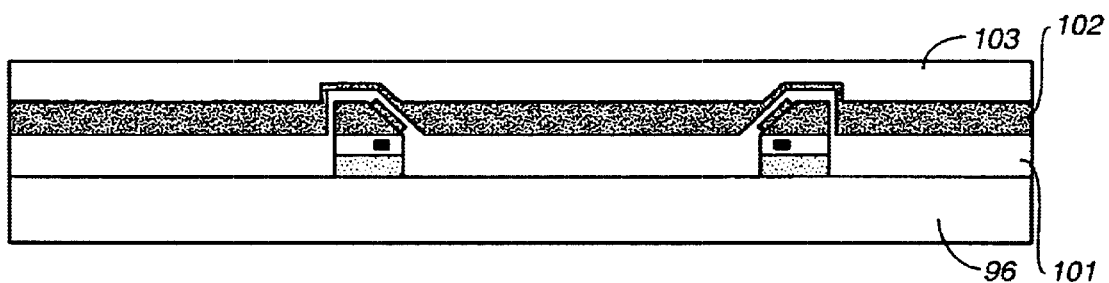
FIG._5o
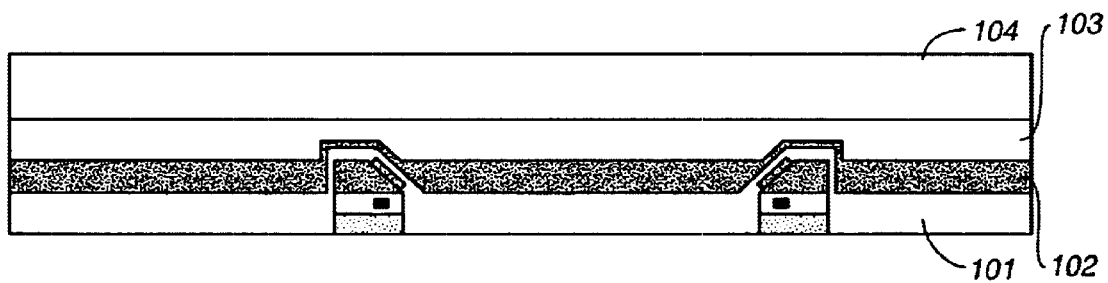
FIG._5p
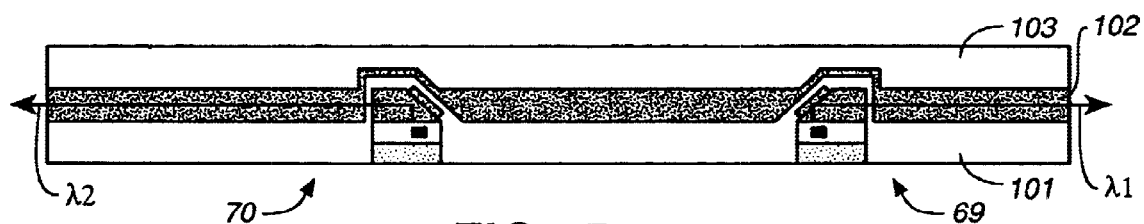
FIG._5q

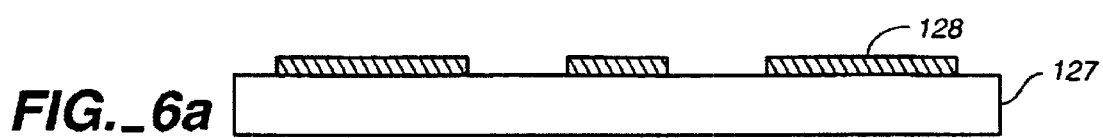
FIG._6a
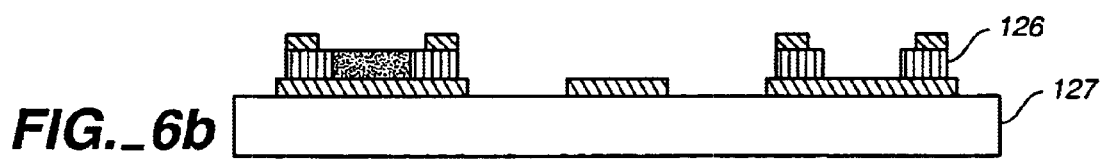
FIG._6b
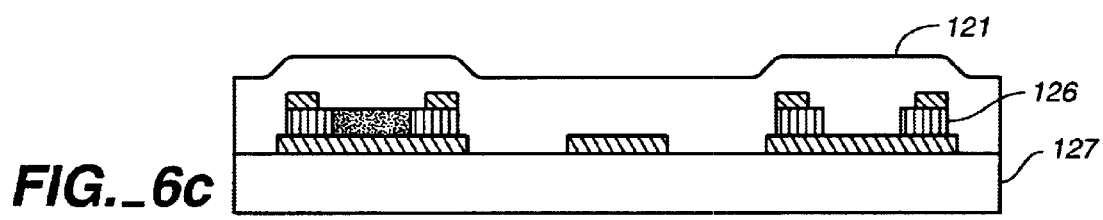
FIG._6c
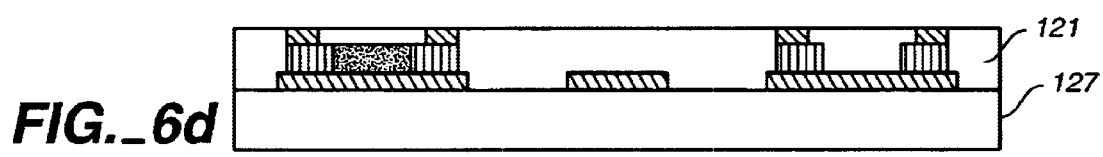
FIG._6d
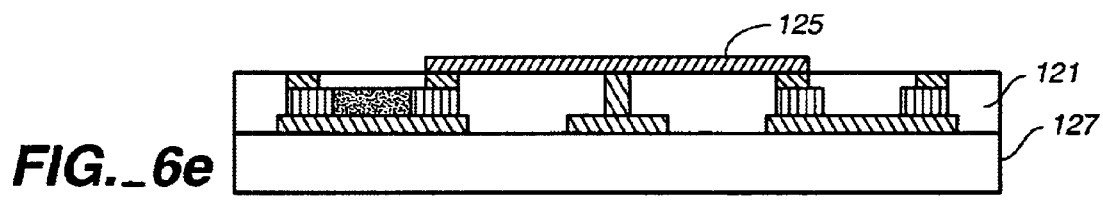
FIG._6e
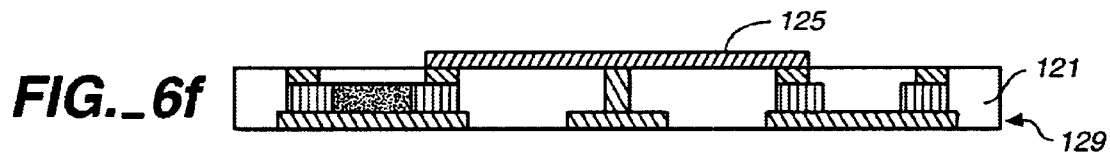
FIG._6f
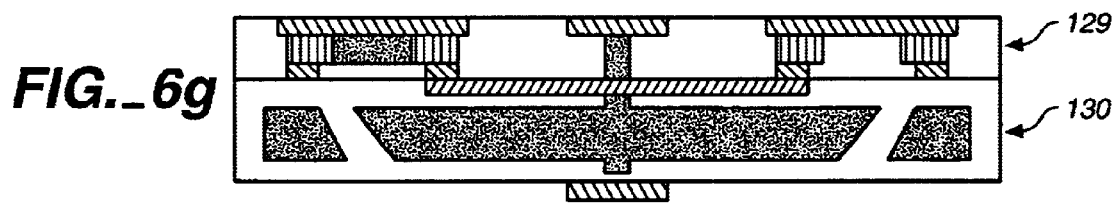
FIG._6g
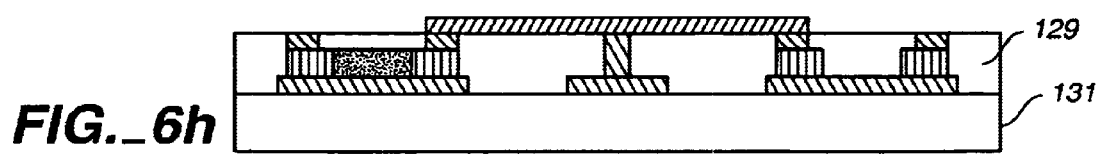
FIG._6h

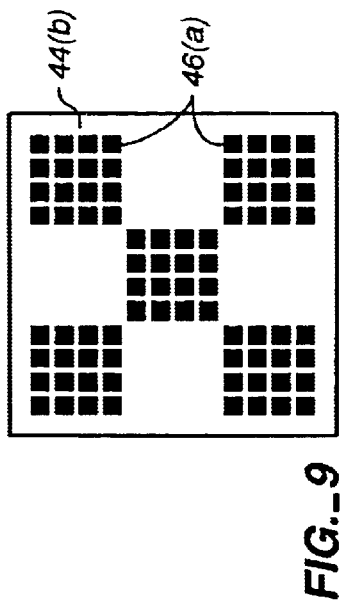
FIG._9
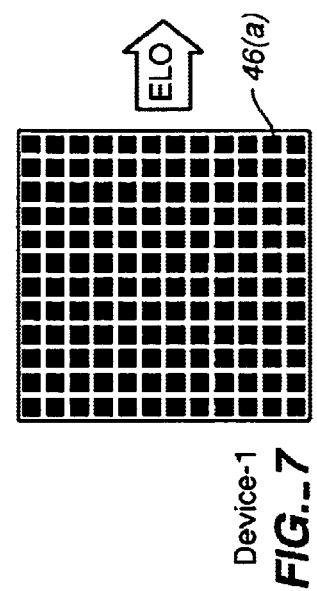
FIG._7
FIG._8
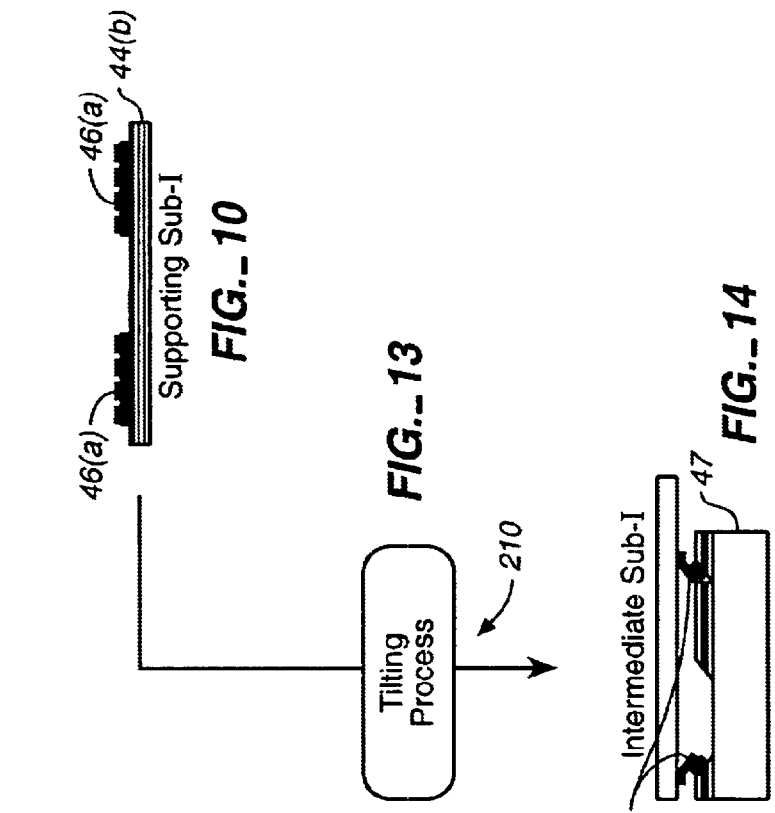
FIG._10
FIG._13
FIG._14
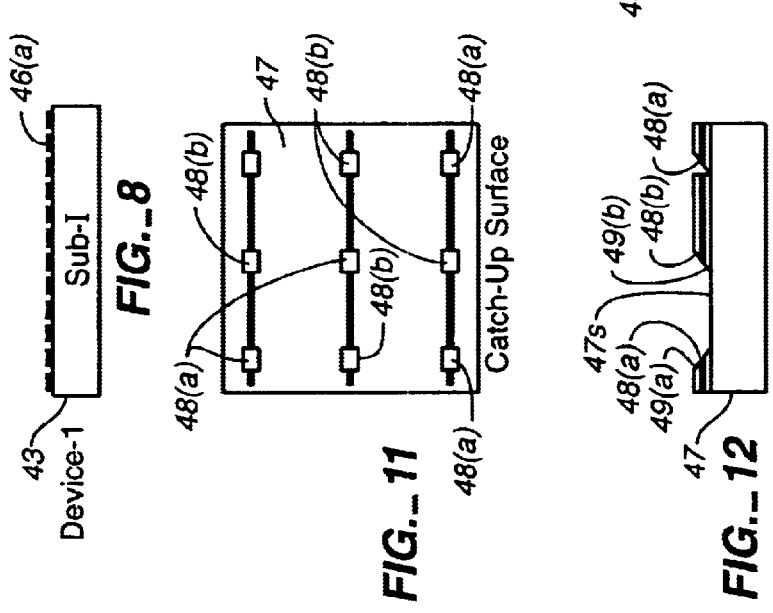
FIG._11
FIG._12

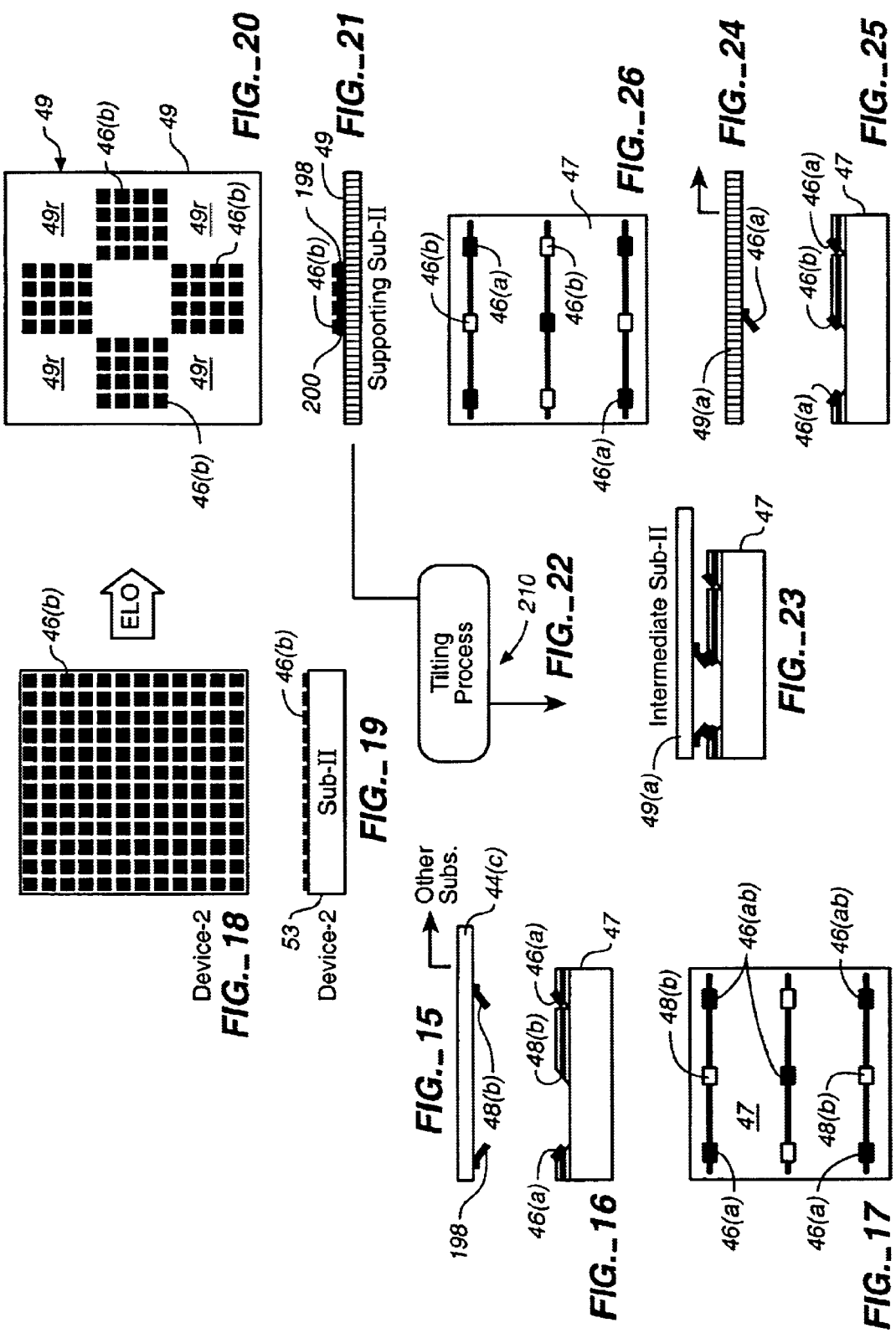

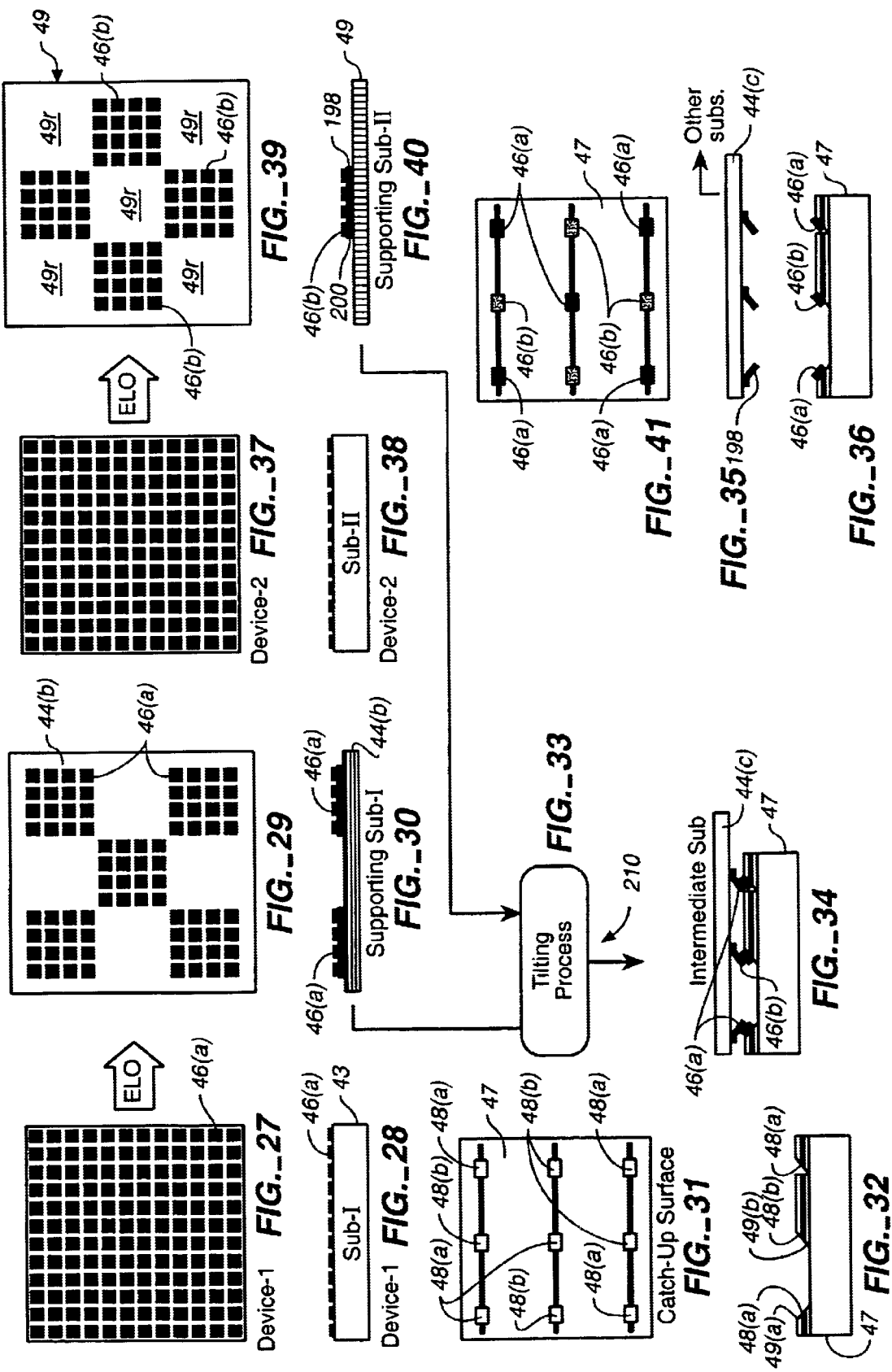

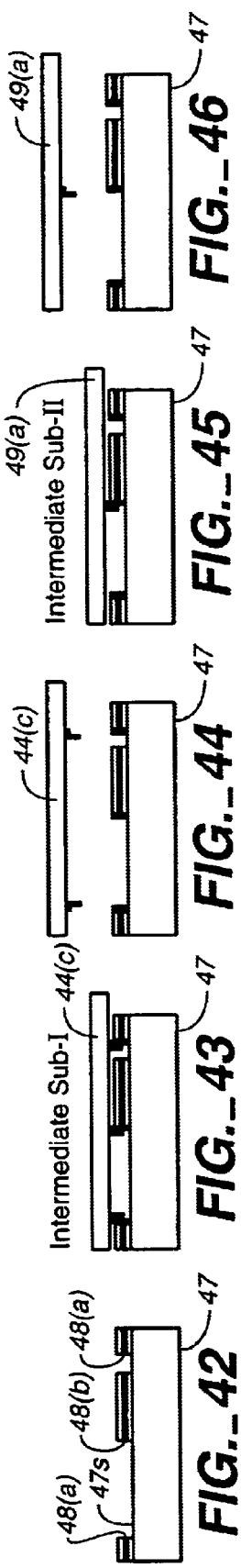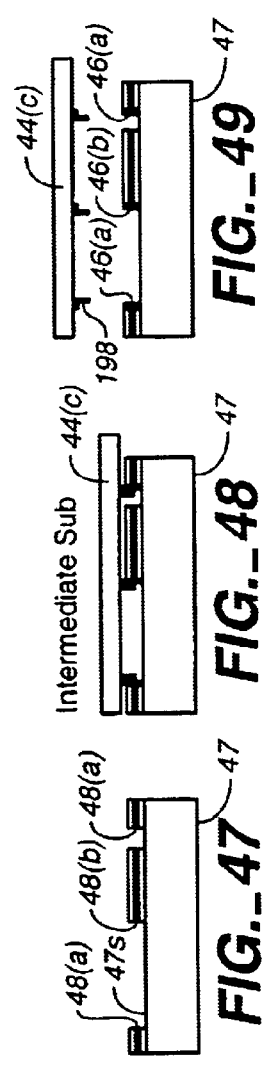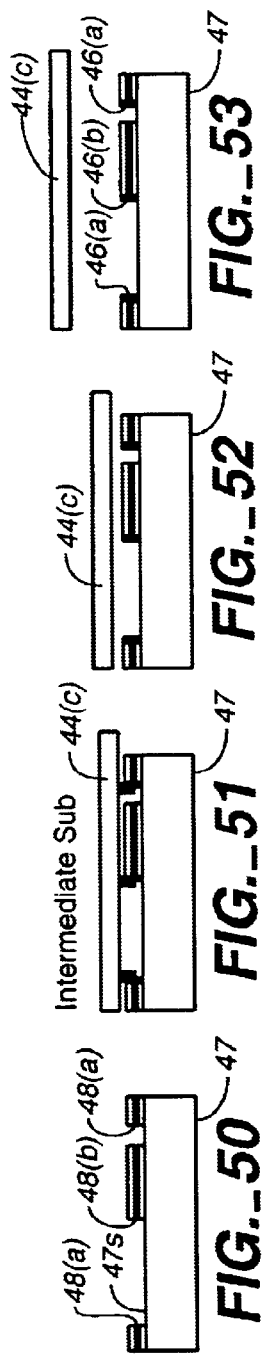

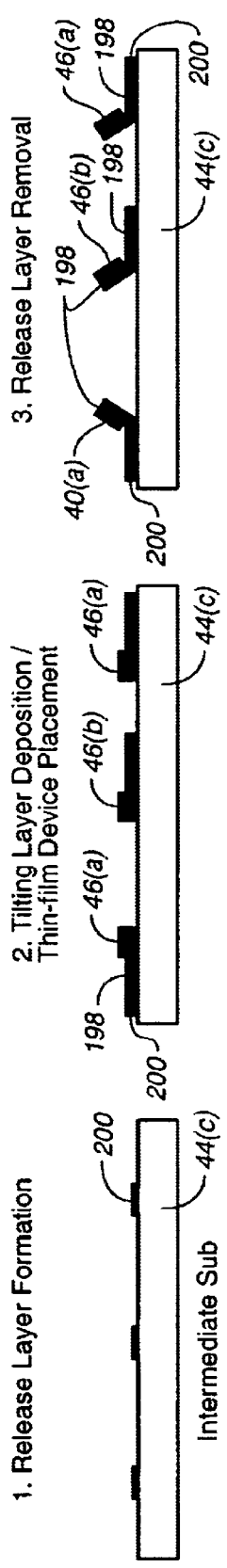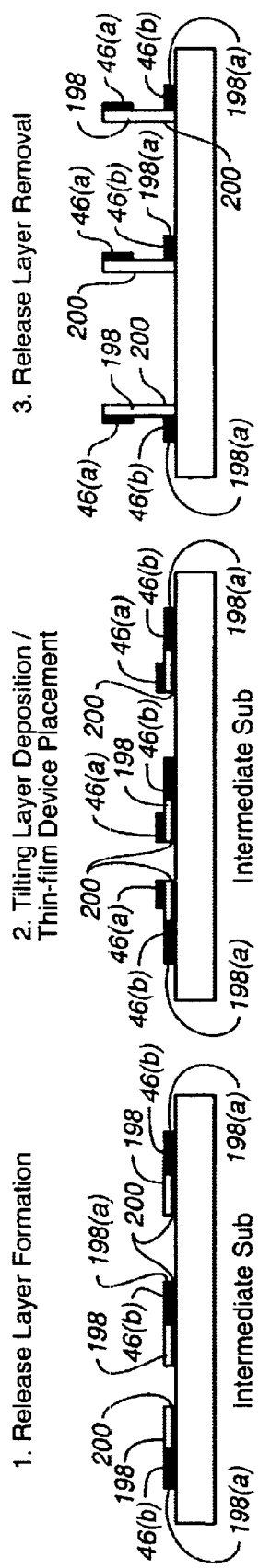

DEVICE TRANSFER METHOD

RELATED APPLICATIONS

This application is a continuation-in-part application of application having Ser. No. 09/489,294, filed Jan. 21, 2000, now abandoned. This patent application is also related to U.S. patent application Ser. Nos. 09/295,431, 09/295,813 now U.S. Pat. No. 6,343,171, and Ser. No. 09/295,628, now U.S. Pat. No. 6,611,635, all of which are herein incorporated by reference in their entirety for all purposes. Benefit of all earlier filing dates is claimed.

FIELD OF THE INVENTION

The present invention provides for methods for transferring devices from one substrate to another substrate. More specifically, embodiments of the present invention relate to methods for transferring devices, particularly optoelectronic devices, from carrier substrates to device substrates.

BACKGROUND OF THE INVENTION

When making a typical optoelectronic apparatus according to one conventional method, a number of individual photodetectors can be formed on a gallium arsenide (GaAs) substrate. After they are formed, the photodetectors may be removed from the GaAs substrate and separated from each other. Each individual photodetector is manipulated, aligned with a device region on a device substrate, and then bonded to the device region. Additional photodetectors are bonded to other device regions on the device substrate in a similar manner and a device assembly is formed. The device assembly can be joined to other assemblies of the same or different type to form an optoelectronic apparatus.

While methods such as this one can be effective in some instances, such methods could be improved. For example, separately manipulating, aligning, and bonding each device to a device substrate is time consuming and labor intensive. The added time and labor needed to form the desired assembly can increase the cost of the assembly. Moreover, alignment errors can occur during the alignment of each device. As the number of device alignment steps increase, the probability that at least one device is misaligned in the desired assembly increases and the likelihood that the desired assembly may be inoperable also increases. Rework of the formed assembly may be needed. Reworking the assembly can increase the cost of the resulting assembly.

Therefore, what is needed and what has been invented is a device transfer method which overcomes the foregoing problems. What is further needed and what has been invented is a device transfer method wherein devices which are to be transferred are placed in controlled directions including tilted and vertical directions.

SUMMARY OF THE INVENTION

Embodiments of the invention are directed to methods for efficiently placing devices on device substrates. Advantageously, in some embodiments of the invention, different device pluralities in a device array can be placed on different device substrates using as few as one alignment step and one device bonding step per device substrate. The number of alignment and bonding steps can be reduced in comparison to conventional methods, and the cost of producing the device assemblies and apparatuses can also be reduced. Accordingly, embodiments of the invention are particularly well suited for mass manufacturing device assemblies.

An embodiment of the invention is directed to a method of forming a device assembly. The method includes: forming a first and second plurality of devices on a formation substrate; transferring the first plurality and the second plurality of devices to a carrier substrate; placing the first plurality of devices on a first plurality of device regions on the first device substrate; and placing the second plurality of devices on a second plurality of device regions on a second device substrate.

Another embodiment of the invention is directed to a method for placing device pluralities on multiple device substrates. The method comprises: providing an array of devices on a carrier substrate, wherein the array comprises multiple device pluralities having devices in predetermined patterns; and respectively placing the device pluralities on device regions in predetermined patterns corresponding to the predetermined patterns of the device pluralities. Preferably, the predetermined patterns of device regions are present on respectively different device substrates.

Further embodiments of the invention include a method for transferring a device from one substrate to another substrate comprising coupling a device to a generally horizontal surface of a first substrate; tilting the device with respect to the generally horizontal surface of the first substrate; and transferring the tilted device from the first substrate to a second substrate. Coupling comprises disposing a release layer on the generally horizontal surface of the first substrate; disposing at least one tilting layer on the release layer; and placing the device on the tilting layer. Tilting of the device comprises releasing at least a portion of the release layer from the horizontal surface of the first substrate. The device may be selected from the group consisting of filters, tunable filters, light modulators, optical switches, light-emitting devices, photodetectors, capacitors, resistors, inductors, integrated circuits, and LSIs.

Another embodiment of the present invention provides a method comprising: forming a first and second plurality of devices on a formation substrate; transferring the first plurality and the second plurality of devices to a carrier substrate; tilting the first plurality and the second plurality of devices with respect to a horizontal surface of the carrier substrate; placing the first plurality of devices on a first plurality of device regions on a first device substrate; and placing the second plurality of devices on a second plurality of device regions on a second device substrate. The method further comprises bonding the first plurality of devices to the first plurality of device regions; and bonding the second plurality of devices to the second plurality of device regions. The method may also comprise bonding the first plurality of devices to the first plurality of device regions using a bonding material disposed on the first plurality of device regions; and bonding the second plurality of devices to the second plurality of device regions using a bonding material disposed on the second plurality of device regions. After forming the first and second plurality of devices on the formation substrate, trenches may be formed to separate each of the devices in the first and second plurality from each other. The first and second pluralities of devices may have the same pattern. At least one device in the first device plurality on the carrier substrate may be disposed between at least two adjacent devices in the second device plurality. The first and second plurality of devices may be separated from the formation substrate using a lift-off process. More specifically, prior to transferring, the first and second plurality of devices may be separated from the formation substrate using an epitaxial liftoff process. The first and second pluralities of devices may be formed on a release layer disposed on the formation substrate. The first plurality of devices comprises at least one of a wavelength filter, a mirror, a hologram, a grating, a light-emitting film, a photodiode, a VCSEL, an optical switch, a photonic crystal, an LD, a photo detector, a transceiver chip, an IC, an LSI, a light modulator, a tunable filter, a wavelength switch and a thin film structure. A capacitor-embedded film may be formed using the first plurality of devices on the first device substrate.

The method further comprises providing a third plurality of devices and a fourth plurality of devices on a second carrier substrate; tilting the third plurality and fourth plurality of devices with respect to a horizontal surface of the second carrier substrate; placing the third plurality of devices on a third plurality of device regions on the first device substrate; and placing the fourth plurality of devices on a fourth plurality of device regions on the second device substrate, wherein the devices in the first plurality of devices and the devices in the third plurality of devices have different operational characteristics. The method may also further comprise providing a third plurality of devices, a fourth plurality of devices, and open regions on a second carrier substrate; tilting the third plurality and fourth plurality of devices with respect to a horizontal surface of the second carrier substrate; placing the third plurality of tilted devices on a third plurality of device regions on the first device substrate so that devices already on the first device substrate are disposed in the open regions; and placing the fourth plurality of tilted devices on a fourth plurality of device regions on the second device substrate so that devices already on the second device substrate are disposed in the open regions.

The method may alternatively further comprise bonding the first plurality of tilted devices to the first plurality of device regions using a first bonding material; and bonding the second plurality of devices to the second plurality of device regions using a second bonding material, wherein the first and second bonding materials include at least one of a diffusion bondable metal and solder. The method may also alternatively include bonding the first and second tilted device pluralities to the device regions on the first and second device substrate using a first bonding material; providing a third plurality of devices and a fourth plurality of devices on a second carrier substrate; tilting the third plurality and fourth plurality of devices with respect to a horizontal surface of the second carrier substrate; bonding the third plurality of tilted devices to a third plurality of device regions on the first device substrate using a second bonding material; and bonding the fourth plurality of tilted devices to a fourth plurality of device regions on the second device substrate using the second bonding material, wherein the first bonding material has a higher bonding temperature than the second bonding material. The first and second device pluralities may comprise optoelectronic devices, and the formation substrate may be crystalline.

The first and second device pluralities may be disposed in a device array wherein the device array comprises at least two groups of devices, and each device group comprises at least one device from the first plurality of devices and at least one device from the second plurality of devices. The first device plurality may be aligned with the first plurality of device regions; and the second device plurality may be aligned with the second plurality of device regions, wherein aligning the second device plurality with the second plurality of device regions comprises shifting the carrier substrate a distance approximately equal to a dimension of a device in the array. Each device group may include a dimension of about Px and about Py, and at least two adjacent device regions on the first device substrate may be separated by a distance approximately equal to about Px or about Py. Placing the first plurality of devices on the first plurality of device regions comprises simultaneously placing the devices in the first plurality of devices on the first plurality of device regions; and placing the second plurality of devices on the second plurality of device regions comprises simultaneously placing the devices in the second plurality of devices on the second plurality of device regions. The device regions on the first device substrate correspond to the locations of input and output terminals of a chip to be mounted to the first device substrate, and wherein the first and second plurality of devices comprises at least one of a photodetector, a photodetector amplifier, a VCSEL, and a VCSEL driver. A chip may be bonded to the first device substrate. The first plurality of device regions and the second plurality of device regions may be at locations corresponding to input and output terminals of the chip, and at least some devices in the first plurality of devices may not be disposed directly under an input or an output terminal of the chip disposed on the device assembly. The method may further comprise, after placing the first and second device pluralities on the first and second device substrates, disposing a cover layer over the first and second device pluralities to embed the first and second device pluralities to form first and second device assemblies. A first plurality of waveguides may be formed on the first device substrate and a second plurality of waveguides may be formed on the second device substrate, such that the waveguides communicate with the devices in the first and second device pluralities. A polymeric cover layer may be deposited on the first device substrate over the first device plurality; and the cover layer may be planarized. The first device substrate may subsequently be removed from the first device plurality.

A further embodiment of the invention provides a method for forming an apparatus comprising forming a first device assembly (e.g., a polymer smart pixel) by using any of the methods of the invention; forming a second device assembly (e.g., a multichip module or a chip scale package or an interface chip layer) by forming an apparatus comprising the first and second device assemblies. Forming the apparatus further comprises laminating the first and second device assemblies to each other.

Embodiments of the present invention are directed to a method for placing device pluralities on device substrates comprising providing an array of devices on a carrier substrate having a generally horizontal surface, wherein the array comprises multiple device pluralities having devices in predetermined patterns; tilting the device pluralities with respect to the generally horizontal surface of the carrier substrate; and respectively placing the tilted device pluralities on device substrates having device regions in predetermined patterns corresponding to the predetermined patterns of the device pluralities. The tilted device pluralities may be bonded to device regions on each of the device substrates using a bonding material. The tilted device pluralities may be respectively aligned with the device regions on the respective device substrates. Each respective alignment preferably comprises shifting the carrier substrate a distance approximately equal to N×d, wherein d is approximately equal to a dimension of a device in the array or a pitch of the devices in the array, and wherein N is an integer of at least one. The array of devices may include groups of devices, wherein each group includes at least one device from each of the tilted device pluralities. The array may alternatively comprise multiple device groups, with each device group including dimensions of about Px and about Py, and wherein adjacent device regions on the device substrates are separated by a distance of about Px or about Py. The array of devices may include groups of devices, and each group may include at least one device from each of the tilted device pluralities; and the device groups may have a pitch in the array, wherein the device group pitch is equal to the pitch of the device regions of each of the device substrates.

Another further embodiment of the present invention provides a method for placing device pluralities on device substrates comprising providing an array of devices on a carrier substrate having a generally horizontal surface, wherein the array comprises multiple device pluralities having devices in predetermined patterns; tilting the device pluralities with respect to the generally horizontal surface of the carrier substrate; and respectively placing the device pluralities on predetermined patterns of device regions corresponding to the predetermined patterns of the device pluralities. The predetermined patterns of device regions may be respectively disposed on different or the same device substrates. The method further comprises mounting a chip on the first device substrate, wherein the device regions on the first device substrate correspond to the locations of input and output terminals of the chip mounted on the first device substrate. The second device assembly may be formed on the first device assembly using a build-up process.

These and other embodiments will be described in more detail below.

BRIEF DESCRIPTION OF THE DRAWINGS

FIGS. 1(a) and 1(b) show cross sections optoelectronic apparatuses.

FIG. 2 shows a perspective view of a device assembly.

FIGS. 3(a) to 3(d) are cross-sectional views of structures used in a method according to an embodiment of the invention.

FIG. 3(e) is a plan view of an array of devices on a carrier substrate before the devices are placed on device substrate.

FIGS. 3(f) to 3(g) are cross-sectional views of structures used in a method according to an embodiment of the invention.

FIG. 3(h) is a plan view of an array of devices on a carrier substrate after a plurality of devices have been removed from the carrier substrate and is placed on a device substrate.

FIG. 3(i) is a plan view of a plurality of devices on a device substrate.

FIGS. 3(j) and 3(k) are cross-sectional views of structures used in a method according to an embodiment of the invention.

FIG. 4(a) is a plan view of a plurality of devices on a formation substrate.

FIG. 4(b) is a cross-sectional view of a plurality of devices on a formation substrate.

FIGS. 4(c) to 4(e) show cross-sectional views of structures used in another embodiment of the invention.

FIG. 4(f) shows a plan view of an array of devices on a carrier substrate.

FIG. 4(g) is a cross sectional view of the structure shown in FIG. 4(f).

FIG. 4(h) is a plan view of a device substrate with device regions.

FIG. 4(i) is a cross sectional view of the structure shown in FIG. 4(h).

FIG. 4(j) is a cross sectional via of a device substrate, and a carrier substrate.

FIG. 4(k) is a plan view of a device substrate with device regions and devices bonded to some of the device regions.

FIG. 4(l) is a cross-sectional view of a carrier substrate and a device substrate.

FIG. 4(m) is a plan view of an array of devices on a formation substrate.

FIGS. 4(n) to 4(q) are cross-sectional views of structures used in a method according to an embodiment of the invention.

FIG. 4(s) shows a plan view of an array of devices on a carrier substrate.

FIG. 4(t) is a cross-sectional view of the structure shown in FIG. 4(s).

FIG. 4(u) is a plan view of a device substrate with devices and device regions.

FIG. 4(v) is a cross-sectional view of the device substrate and devices shown in FIG. 4(u).

FIG. 4(w) is a cross-sectional view of structures used in a method according to an embodiment of the invention.

FIG. 4(x) is a plan view of an assembly having two different types of devices on a device substrate.

FIG. 4(y) is a cross-sectional view of the assembly shown in FIG. 4(x) and a carrier substrate with devices.

FIGS. 5(a) to 5(q) show cross-sectional views of structures used in a method for making a device assembly.

FIGS. 6(a) to 6(h) show cross-sectional views of structures used in a method for making a device assembly.

FIG. 7 is a top plan view of a plurality of devices on a formation substrate;

FIG. 8 is a vertical sectional view of the plurality of devices on the formation substrate of FIG. 7;

FIG. 9 is a top plan view of an array of devices on a carrier substrate, produced from the plurality of devices on the formation substrate of FIG. 7 by an epitaxial lift-off procedure.

FIG. 10 is a vertical sectional view of the structure shown in FIG. 9.

FIG. 11 is a top plan view of a device substrate with device regions.

FIG. 12 is a vertical sectional view of the structure shown in FIG. 11.

FIG. 13 is a block diagram representing an embodiment of the device tilting procedure, such as by way of example only, is illustrated in FIGS. 54–59.

FIG. 14 is a vertical sectional view of a device substrate coupled to a carrier substrate for receiving at least one device from the carrier substrate.

FIG. 15 is a side elevational view of the carrier substrate in FIG. 14 after being decoupled from the device substrate and after at least one device was transferred to the device substrate from the carrier substrate.

FIG. 16 is a side elevational view of the device substrate in FIG. 14 after being decoupled from the carrier substrate and after at least one device was transferred to the device substrate from the carrier substrate.

FIG. 17 is a top plan view of a device substrate of FIG. 16 with device regions and devices bonded to some of the device regions, leaving residual, unfilled device regions.

FIG. 18 is a top plan view of a plurality of devices on a formation substrate, with the devices in FIG. 18 each being a different device than the devices in FIG. 7.

FIG. 19 is a vertical sectional view of the plurality of devices on the formation substrate of FIG. 18.

FIG. 20 is a top plan view of another embodiment of an array of devices on a carrier substrate, produced from the plurality of devices on the formation substrate of FIG. 18 by an epitaxial lift-off procedure.

FIG. 21 is a vertical sectional view of the structure in FIG. 20.

FIG. 22 is a block diagram representing an embodiment of the tilting procedure for devices.

FIG. 23 is a vertical sectional view of the device substrate of FIG. 17 coupled to the carrier substrate of FIGS. 20 and 21 for receiving at least one device from the carrier substrate in available, unfilled device regions.

FIG. 24 is a side elevational view of the carrier substrate in FIG. 23 after being decoupled from the device substrate and after at least one device was transferred to the device substrate from the carrier substrate.

FIG. 25 is a side elevational view of the device substrate in FIG. 22 after being decoupled from the carrier substrate in FIG. 23 and after at least one device was transferred to the device substrate from the carrier substrate.

FIG. 26 is a top plan view of the device substrate of FIG. 25 and having all device regions filled with a device from FIG. 9 or with a device from FIG. 20.

FIG. 27 is a top plan view of a plurality of devices on a formation substrate.

FIG. 28 is a vertical sectional view of the plurality of devices on the formation substrate of FIG. 27.

FIG. 29 is a top plan view of an array of devices on a carrier substrate, produced from the plurality of devices on the formation substrate of FIG. 27 by an epitaxial lift-off procedure.

FIG. 30 is a vertical sectional view of the structure shown in FIG. 29.

FIG. 31 is a top plan view of a device substrate with device regions.

FIG. 32 is a vertical sectional view of the structure shown in FIG. 31.

FIG. 33 is a block diagram representing an embodiment of the device tilting procedure, such as by way of example only, is illustrated in FIGS. 54–59.

FIG. 34 is a vertical sectional view of a device substrate coupled to a carrier substrate for receiving at least one device from the carrier substrate.

FIG. 35 is a side elevational view of the carrier substrate in FIG. 34 after being decoupled from the device substrate and after at least one device was transferred to the device substrate from the carrier substrate.

FIG. 36 is a side elevational view of the device substrate in FIG. 34 after being decoupled from the carrier substrate and after at least one device was transferred to the device substrate from the carrier substrate.

FIG. 37 is a top plan view of a plurality of devices on a formation substrate, with the devices in FIG. 37 each being a different device from the devices in FIG. 27.

FIG. 38 is a vertical sectional view of the plurality of devices on the formation substrate of FIG. 37.

FIG. 39 is a top plan view of another embodiment of an array of devices on a carrier substrate, produced from the plurality of devices on the formation substrate of FIG. 37 by an epitaxial lift-off procedure.

FIG. 40 is a vertical sectional view of the structure in FIG. 39.

FIG. 41 is a top plan view of the device substrate of FIG. 31 and having all device regions filled with a device from FIG. 29 or with a device from FIG. 37.

FIG. 42 is a side elevational view of a device substrate having vacant device regions which are normal or perpendicular to a horizontal surface of the device substrate.

FIG. 43 is a side elevational view of the device substrate of FIG. 42 coupled to a first carrier substrate with two devices to be transferred coupled thereto.

FIG. 44 is a side elevational view of the first carrier substrate of FIG. 43 decoupled from the device substrate after the transferring of at least one device and leaving at least one unfilled device region.

FIG. 45 is a side elevational view of the device substrate of FIG. 44 coupled to a second carrier substrate having devices (i.e., a single type device) different from the type of devices on the carrier substrate in FIG. 43.

FIG. 46 is a side elevational view of the second carrier substrate decoupled from the device substrate after transferring at least one device.

FIG. 47 is a side elevational view of a device substrate having vacant device regions which are normal or perpendicular to a horizontal surface of the device substrate.

FIG. 48 is a side elevational view of the device substrate of FIG. 47 coupled to a carrier substrate with the carrier substrate carrying three devices, with at least two of the devices being different types of devices.

FIG. 49 is a side elevational view of the carrier substrate decoupled from the device substrate after transferring different types of devices.

FIG. 50 is a side elevational view of a device substrate having vacant device regions which are normal or perpendicular to a horizontal surface of the device substrate.

FIG. 51 is a side elevational view of the device substrate of FIG. 50 coupled to a carrier substrate with the carrier substrate carrying different types of devices.

FIG. 52 is a side elevational view of the carrier substrate after transferring different types of devices and after etching the layers or tabs (e.g., the microelectromechanical system, MEMS, at least partially etched away) from which the different types of devices were removed and transferred.

FIG. 53 is a side elevational view of the carrier substrate of FIG. 52 removed from the device substrate and after etching or removing the layers or tabs from which the different types of devices were removed and transferred.

FIG. 54 is a side elevational view of a carrier substrate having a plurality of release layers.

FIG. 55 is a side elevational view of the carrier substrate of FIG. 54 after depositing at least one tilting layer on each release layer and after depositing a thin-film device on each of the tilting layers.

FIG. 56 is a side elevational view of the substrate assembly of FIG. 55 after the devices have been tilted by removing and/or bending or tilting the release layer which is underneath each device.

FIG. 57 is a side elevational view of a carrier substrate supporting a plurality of release layers, a tilting layer disposed on each of the release layers, and a first type device disposed on each of the tilting layers.

FIG. 58 is a side elevational view of the substrate assembly of FIG. 57 after disposing a second type device on each of the tilting layers.

FIG. 59 is a side elevational view of the substrate assembly of FIG. 58 after releasing the portion of the release layer from the carrier substrate that is underneath each of the second type devices and bending the released portion of the release layer into a perpendicular position with respect to the carrier substrate in order to tilt each of the second type devices.

It is understood that aspects of the figures may have been simplified for clarity of illustration, and that embodiments of the invention are not limited to the particular embodiments shown in the figures.

DETAILED DESCRIPTION OF PREFERRED EMBODIMENTS OF THE INVENTION

The methods according to embodiments of the invention can be used to produce assemblies and apparatuses which have electrical, optical, or optoelectronic characteristics. Preferably, the assemblies and apparatuses include optoelectronic devices such as VCSELs (vertical cavity surface emitting lasers), PDs (photodetectors), light modulators, optical switches, or wavelength switches. Examples of optoelectronic apparatuses are shown in FIGS. 1(a) and 1(b). Other examples of optoelectronic apparatuses and assemblies include polymer smart pixels (PSPs), optoelectronic system boards (OE-SB), optoelectronic superinterposers (OE SIPs), optoelectronic backplanes (OE-BP), optoelectronic system boards (OE-SB), optoelectronic multichip modules (OE-MCMs), film optical link modules (FOLMs), and three-dimensional optoelectronic stack multichip modules (3-D OE MCMs). These and other assemblies and apparatuses are described in greater detail in U.S. patent application Ser. Nos. 09/295,431, 09/295,813, now U.S. Pat. No. 6,343,171, and Ser. No. 09/295,628, now U.S. Pat. No. 6,611,635. Each of these patent applications is herein incorporated by reference in their entirety.

FIG. 1(a) shows an optoelectronic apparatus including two device assemblies 105 coupled to an optoelectronic backplane 104 (OE-BP). The optoelectronic backplane 104 includes a waveguide 104(a) and optical filters. Electrical substrates 107 comprising one or more layers of electrical circuitry (not shown) are disposed underneath respective device assemblies 105. A number of chips 116 (or a single chip) are disposed on top of the device assemblies 105. Plural conductive interconnect structures 118 electrically couple the device assembles 105 to the electrical substrates 107 and to the chips 116. Each device assembly 105 includes a number of optoelectronic devices 111 and optical devices 110 which transmit, receive and/or route optical signals. The optical devices 110 may be optical filters consisting of, for example, multiple dielectric layers or photonic crystals, and the optoelectronic devices 111 may be VCSELs and PDs. Here, in FIG. 1(a), only two device assemblies 105 are shown. In many other embodiments, many assemblies are coupled to the OE-BP. In typical systems, the device assemblies may process or route optical signals with four or more different wavelengths.

FIG. 1(b) shows an optoelectronic apparatus including first and second device assemblies 130, 136 adjacent to each other. The first device assembly 136 primarily includes embedded electrical devices 132 such as LSI chips, resistors, capacitors, transceivers, and IC chips containing MUX/DEMUX circuits, error correction circuits, timing control circuits, and noise reduction circuits. The electrical devices 132 may also include any suitable combination of interface IC chips including any combination of transceiver circuits (including driver and amplifier), MUX/DEMUX circuits, error correction circuits, noise reduction circuits, etc., so that the device assembly 136 is an interface-chip embedded film. The film can be laminated to the second device assembly 130 and/or may be built-up onto the second device assembly 130. It is also possible to laminate the second device assembly to the first device assembly and/or one may build-up the second device assembly on the first device assembly. Also, in FIG. 1(b), two types of via structures are shown in the first device assembly 136. One type of via structure is disposed in areas surrounding the devices 132 (e.g., chips), and the other type of via structure is coupled to the devices 132 (e.g., chips).

The second device assembly 130 includes embedded optoelectronic devices 138 (e.g., VSCELs and PDs) and embedded optical devices 131 (e.g., filters). An electrical substrate 139 having one or more layers of circuitry (not shown) and one or more dielectric layers of, e.g., polymer or ceramic, is disposed under the first and second device assemblies 130, 136, and chips 133 are disposed on top the device assemblies 130, 136. The electrical substrate 139, the first device assembly 136, the second device assembly 130, and the chips 133 are electrically coupled together via a number of interconnect structures 134 (e.g., solder joints, metal diffusion joints, or conductive adhesive joints). A two-dimensional fiber array is coupled to the second device assembly 130 and provides optical signals having predetermined wavelengths to the second device assembly 130, and vice versa. The optical signals pass through waveguides 137 in the second device assembly 130.

Other arrangements are possible. The first or second device assemblies can be pure electrical assemblies such as PCBs (Printed Circuit Boards) and MCMs. For example, the second device assembly can be an electrical circuit board. In a preferred embodiment, the electrical devices in the device assembly are capacitors or interface IC chips, so that the formed device assembly is a capacitor embedded film (CEM) or a thin film interface-chip embedded film, respectively. Regardless of which type is to be formed, the film can be laminated to the second device assembly or may be built-up on the second device assembly 130. The apparatus shown in FIG. 1 can be useful for, e.g., WDM backplane communication, massive parallel optical links, and optoelectronic backplanes.

FIG. 2 shows an example of a device assembly. The device assembly includes a waveguide array coupling region 114 (or optical fiber array or image guide coupling region) where a waveguide array (or optical fiber array or image guide) (not shown) can be coupled to the device assembly. The device assembly also includes a plurality of optoelectronic devices 115 which are coupled to the waveguide array coupling region 114 via waveguides 113. A chip (not shown) may be disposed on the device assembly above the optoelectronic devices 115. The optoelectronic devices 115 are in communication with each of the optical devices 115 via the chip's input and output terminals. In this regard, the pattern formed by the optoelectronic devices 115 may correspond to the input and output terminals on the chip. The input and output terminals of the chip can be electrically coupled to the optoelectronic devices 115 via plural interconnect structures (e.g., solder joints). When one or more chips are disposed on the device assembly, the device assembly may be a chip scale package (CSP) or a multichip module (MCM).

Embodiments of the invention can be used to form these and other device assemblies and apparatuses in a highly efficient manner. The number of manipulating, aligning, and/or bonding steps used in embodiments of the invention is reduced as compared to conventional processes. In one embodiment, a first plurality and a second plurality of devices are disposed in an array on a carrier substrate prior to being placed on device regions on different device substrates. The device regions are locations on a device substrate where devices are to be placed. The device regions on the device substrate preferably correspond to the input and output terminals of a chip disposed on the device substrate. However, the device regions can be at any suitable location on the device substrates. For instance, the one or more device regions may be disposed at regions of a device substrate which are not under an input or output terminal of a chip disposed on the device substrate. Preferably, the patterns formed by the device regions on the first and second device substrates are the substantially the same, and the patterns formed by the first and second device pluralities are substantially the same. Also, each of the devices in the array preferably has substantially the same dimensions.

The first plurality of devices on the carrier substrate may be bonded to device regions on the first device substrate. To assist in the bonding process, a bonding material may be deposited on each of the device regions. Exemplary bonding materials and processes are described in more detail below. Preferably, all devices in the first device plurality are placed on and bonded to the first substrate at the same time. Since all of the devices in a particular plurality of devices may be aligned and bonded at the same time, the number of alignment and bonding steps is reduced as compared to some conventional device placement processes.

After a first device plurality is bonded to a first device substrate, the second device plurality on the carrier substrate is aligned with device regions on a second device substrate. The device regions on the second device substrate can be positioned at the same location as the device regions on the first device substrate when the first plurality of devices was bonded to them. When aligning the carrier substrate with the device regions on the second device substrate, the carrier substrate can be shifted in a direction parallel to the plane formed by the array. The distance of the carrier substrate shift may be substantially equal to N×d. "d" is a dimension of a device (e.g., length, width) including the boundary trench region in the array and/or is a pitch of the devices in the array, while N is an integer of one or more. The device "pitch" is the distance between corresponding points (e.g., device centers, device corners) on adjacent devices. After the second device plurality and the second plurality of bonding regions are aligned, the devices in the second device plurality are bonded to a second plurality of device regions.

Although the use of optoelectronic devices is described in some detail, it is understood that the methods, assemblies and apparatuses according to embodiments of the invention may use any suitable device. The devices may be passive or active, and may include any suitable number or combination of electrical, optical, or optoelectronic elements. Examples of suitable devices include lasers such as VSCELs, VSCEL drivers, LDs, LD drivers, light modulators, light modulator drivers, photodetectors, holograms, surface normal couplers, photodetector amplifiers, optical switches, optical switch drivers, filters (e.g., filters formed using multiple dielectric films), tunable filters, wavelength switches, waveguide elements, photonic crystals, waveguides, optical amplifiers, interferometers, nonlinear optical devices, semiconductor devices, mirrors (e.g., micromirrors), lenses, transceiver chips, gratings, LSI chips, IC chips, capacitors, resistors, registers, inductors, and any desired combination thereof.

Preferably, the devices include optoelectronic devices having an active layer. Also preferably, the active layer includes semiconductors such as silicon and Group III–V compounds such as GaAs and InP, and may include multiple sublayers. A pair of electrodes may be operatively coupled to the active layer. For example, the active layer can be sandwiched between two electrodes. Devices such as VCSELs may have electrodes with apertures (e.g., a ring-shaped electrode) to permit the passage of light from the active layer through the electrodes.

The devices may also include small thin films of material. For example, the small thin films may include high refractive index films such as $TiO_2$, $WO_3$, $SiN_x$, Si, etc. Rare earth metal-doped glass thin films are another example. The devices may also include small thin films of high dielectric constant materials such as BST, BTO, PLZ, PLZT, etc. Illustratively, processes such as sputtering, evaporation, CVD, and plating can be used to deposit a layer of material on a formation substrate. Then, the deposited layer can be cut with a cutting device or etching to form an array of small thin films.

The devices may have any suitable geometry. In some embodiments, the devices may be less than about 100 microns thick, and preferably less than about 20 microns thick. The devices may have any suitable length and width. In some embodiments, the devices may have a length of less than about 60 microns and a width of less than about 60 microns. For instance, the devices may have a length and width in the range of about 10 to about 50 microns, or less. Typically, each of the devices has a major surface in the shape of a square, rectangle, or other polygon.

Each device plurality is present in an array before being bonded to the different device substrates. The different device pluralities within the array may have the same pattern, and the devices making up the different pluralities may be intermingled in the array. Adjacent devices within a device plurality may be separated by devices in other pluralities. Also, the devices within the device array or within a device plurality may be of the same or different type. For instance, the devices in a device plurality may be all PDs or may include both PDs and VSCELs. Moreover, a device array or a device plurality may include any suitable number of devices. For example, the number of devices in a device array or a device plurality may be as few as four, but is typically has greater than fifty devices.

The device array can be formed in any suitable manner. For example, an array of semiconductor devices can be formed on a semiconductor substrate. Each of the semiconductor devices in the array can be separated by dry or wet etched trenches at the device boundaries, or scribe lines which can be later cut with a saw or laser to separate the semiconductor devices in the array from each other. A tacky carrier substrate can then be bonded to the cut array to transfer it to the carrier substrate. Alternatively, the semiconductor device array can be separated or cut after it is on the carrier substrate (without cutting the carrier substrate).

Preferably, the device array is formed on a formation substrate. The formation substrate can be in any suitable form including a wafer. Moreover, the formation substrate may comprise any suitable material including an amorphous or crystalline (e.g., semicrystalline or a single crystal) material. Preferably, the formation substrate comprises silicon or a Group III-V compound material such as GaAs and InP.

In preferred embodiments, a release layer is formed on a formation substrate before the device array is formed on the formation substrate. The release layer can be formed by any suitable process (e.g., CVD, MOCVD, etc.) and may include any suitable material (e.g., a semiconductor material, an inorganic material). After the device array is formed, the array can be separated from the formation substrate using the release layer. In preferred embodiments, the release layer can be decomposed. After decomposition, the array can be separated from the formation substrate.

In some embodiments, an organic polymer material may be coated as the release layer on a transparent formation substrate (e.g. quartz or glass). The release layer can be decomposed by radiation (e.g. UV) using, e.g., an excimer laser or a UV YAG laser, thus releasing the device array. If polymer residue remains on the device array after the array is released, the residue can be cleaned by plasma etching or any other suitable process. It is also possible to remove the formation substrate by decomposing or milling (e.g., etching) the entire formation substrate. In some embodiments, an etch-stop layer can be disposed between the formation substrate and device array to protect the device array. Alternatively, back-side polishing or etching can be used to remove the formation substrate. In some cases, the formation substrate is not removed completely, and a partial formation substrate is left at the backside of the thin-film devices.

After forming the device array, the device array is disposed on a carrier substrate. The carrier substrate may be the same as the formation substrate, but is preferably different from the formation substrate. In preferred embodiments, the array of devices can be bonded to the carrier substrate and then separated from the formation substrate. In some embodiments, all of the devices in the device array are preferably transferred to the carrier substrate simultaneously. For instance, the device array can be formed on a formation substrate. After the array is formed, a carrier substrate can be laminated to the array. The adhesive force between the device array and the carrier substrate is greater than the adhesive force between the device array and the formation substrate. Consequently, all of the devices in the device array can be transferred from the formation substrate to the carrier substrate as they separate from each other.

The carrier substrate is preferably rigid and can be made of any suitable material including rigid polymeric materials, glass, ceramic, and metal. The carrier substrate may be inherently tacky so that devices can bond directly to the carrier substrate. If the carrier substrate is not inherently tacky, a bonding material may be disposed on the carrier substrate to bond the devices to the carrier substrate. The bonding material may include adhesives such as epoxy or polyimide-based adhesive materials and/or deformable materials such as black wax, petroleum jelly, VASELINE®, and APIEZON®W. Pressure sensitive adhesives may also be used as the bonding material. The bonding material may be disposed on the carrier substrate surface as a continuous or a discontinuous layer. Discontinuous bonding layers may be desirable to selectively bond and remove devices in the device array, e.g., to form a new device array.

In preferred embodiments, the devices are separated from the formation substrate using a lift off process such as an epitaxial lift off (ELO) process. In a typical lift off process, a device array is formed on a release layer on a formation substrate. The release layer may comprise, for example, an etchable material such as $Al_xGa_{1-x}As$, where x is between about 0 and about 1. Trenches are formed between adjacent devices so that the lateral edges of adjacent devices do not contact each other. The devices remain attached to the release layer after the trenches are formed. Then, the release layer is etched to sever the connection between the substrate and the devices so that the devices can be separated from the formation substrate.

An exemplary ELO process can be described with reference to FIGS. 3(a) to 3(d). With reference to FIG. 3(a), a release layer 11 is formed on a formation substrate 13. The formation substrate 13 can have a crystalline (e.g., a single crystal) surface which promotes the growth of a crystalline release layer 11. For example, the formation substrate 13 may be a single crystal GaAs substrate. The release layer 11 preferably comprises an etchable and/or epitaxial material such as AlAs, which can be grown on the formation substrate 13. Any suitable process including sol-gel, MBE, CVD (e.g., MOCVD), PVD or OMVPE can be used to form the release layer 11. After depositing the release layer 11, a device layer 12 including a device array is formed on the release layer 11. The device layer 12 and each of the devices in the device array may include one or more sublayers of material such as one or more sublayers comprising epitaxial GaAs and $Al_xGa_{1-x}As$ (0<x<1). After the device array is formed, trenches 15 are formed in the device layer 12 and optionally through the release layer 11 to separate adjacent devices 16 from each other. In this regard, the depth of the trenches 15 is greater than or equal to the thickness of the devices 16 (e.g., greater than about 3 microns). After the trenches 15 are formed, the lateral edges of adjacent devices 16 do not contact each other and the devices 16 remain attached to the formation substrate 13. The devices 16 are then bound to a carrier substrate 14, preferably via a bonding material such as black wax. In some embodiments, the carrier substrate 14 can be laminated to the array of devices 16 or the array of devices 16 can be laminated onto the carrier substrate 14. The release layer 11 is then laterally etched to sever any physical connection between the devices 16 and the formation substrate 13. For example, the structure shown in FIG. 3(c) can be exposed to an etching bath such as a hydrofluoric acid (HF) bath. In the bath, the HF can laterally etch an AlAs release layer. As a result of the lateral etching and as shown in FIG. 3(d), the devices 16 can separate from the formation substrate 13 while still being attached to the carrier substrate 14.

Using a lift off process with a release layer to separate the array from the formation substrate has a number of advantages. For example, by using a lift off process with release layer, a formation substrate 13 can be reused to form additional device arrays. Formation substrates such as single crystal GaAs wafers can be quite expensive. Consequently, reusing the formation substrate when producing additional device arrays can reduce manufacturing costs.

Although an epitaxial liftoff process using a release layer is a preferred process, as noted above, it is also possible to remove the formation substrate by etching the entire formation substrate. In this case, the release layer 11 could illustratively be an etch-stop layer. Then, the entire formation substrate 13 can be etched. Back-side polishing and back-side etching can be used to make the substrate thin or remove the substrate.

The device array on the carrier substrate 14 can have any suitable number of device pluralities which are transferable to different device substrates. The number of device pluralities in an array typically equals the number of device substrates to be processed. For example, in the array 50 shown in FIG. 3(e), a first plurality of devices labeled "a" (e.g., devices 1a through 9a) can be transferred to a first device substrate, a second plurality of devices labeled "b" can be transferred to a second device substrate, a third plurality of devices labeled "c" can be transferred to a third device substrate, etc. The patterns formed by the different device pluralities can correspond to device region patterns on the different device substrates to which they are bonded. In this regard, the devices within each device plurality can be disposed in a predetermined pattern. For example, with reference to FIG. 3(e), the first plurality of devices labeled "a" and the second plurality of devices labeled "b" each have nine devices disposed in the same pattern. Preferably, at least one device in a particular device plurality is spaced apart from the other devices within the same plurality, and the devices in the different pluralities are intermingled in the array. For example, as shown in FIG. 3(e), each of the devices 1a through 9a in the first plurality of devices is spaced apart from each other. As shown, adjacent devices within a device plurality (e.g., devices 1a and 2a) may be separated by one or more devices (e.g., 1b, 1c) from other device pluralities. By spatially separating the devices in each plurality, devices can be placed over wider areas of the device substrates without increasing the size of the carrier substrate.

The device array 50 may also include a number of device groups. Each group is typically a cluster of devices in the device array. For example, as shown in FIG. 3(e), the array of devices 50 includes nine groups of devices respectively including labels "1" to "9". Each of the device groups in the array 50 may include at least one device from each of the different device pluralities. In the array 50 shown in FIG. 3(e), each of the nine device groups includes at least one device from each of the device pluralities "a" through "i". For example, group "1" may include devices 1a through 1i.

The device groups in the array 50 may have any suitable dimensions or pitch. The group "pitch" may be the distance between corresponding points on adjacent groups (e.g., corner to corner, or center to center). For example, with reference to FIG. 3(e), each device 16 in the array 50 may have planar dimensions of 40×40 microns. Each device group in the array 50 can have a dimension Px of 120 microns and a dimension Py of 120 microns. As shown in FIG. 3(e), each dimension Px and Py can be substantially equal to the distance formed by the edges of three devices 16. In this example, each device group is in the form of a square, and the pitch of the device groups may be about 120 microns for the 40×40 micron devices. The devices may have slightly smaller dimensions due to the formed trenches at the device boundary regions.

In some embodiments, some device groups may include devices of a first type, while other groups have devices have different types of devices. For example, with reference to FIG. 3(e), groups 2, 4, 6, and 8 may have PDs, while groups 1, 3, 5, 7, and 9 may have VCSELs. When the devices in the device plurality labeled "a" are bonded to a device substrate, a device from each of groups 1 through 9 is removed (e.g., 1a, 2a, 3a, 4a, 5a, 6a, 7a, 8a, and 9a). The bonded devices include both PDs and VCSELs. The placement of the devices on a device substrate can be such that the locations of the PDs will correspond to input terminals and the locations of the VCSELs correspond to the output terminals of a chip eventually disposed on the device substrate.

After the devices are separated from the formation substrate and are transferred to the carrier substrate, the devices can be transferred to one or more device substrates. With reference to FIGS. 3(f) and 3(g), a first plurality of devices 16(a) on the carrier substrate 14 can be aligned with device regions 18(a) on a first device substrate 17(a). A bonding material 19(a) may be deposited on the device regions 18(a). Once aligned, the carrier substrate 14 can move down and then the first device plurality 16(a) can contact and bond to the bonding material 19(a) on the device regions 18(a). Preferably, uniform pressure is applied to the carrier substrate 14 to bond the first device plurality 16(a) to the device substrate 17(a). Once the first device plurality 16(a) bonds to the device regions 18(a), the carrier substrate 14 can move up and away from the device substrate 17(a) leaving the first device plurality 16(a) on the device substrate 17(a). Other devices in the array can remain on the carrier substrate 14 for transfer to other device substrates. The bond strength between each of the device regions 18(a) and the devices 16(a) is preferably greater than the bond strength between devices 16(a) and the carrier substrate 14 so that the carrier substrate 14 can be separated from the devices 16(a) while leaving other devices on the device substrate 17(a).

As shown in FIG. 3(h), a number vacated regions 10 can be present in the device array 50 where the first plurality of devices have been removed. Other devices 16 in the array 50 remain on the carrier substrate for transfer to other device substrates. As shown in FIG. 3(i), the first plurality of devices 16(a) can be disposed on the device substrate 17(a) in a pattern which corresponds to the pattern of bonding material 19(a) and device regions 18(a) on the first device substrate 17(a). The pitch (e.g., P) of the device regions and the devices 16(a) disposed on the device regions may be substantially equal to a dimension of a device group in the array (including the trench region) 50 or a pitch (e.g., Px or Py) of the device groups in the device array 50.

As noted, the device regions are locations on a device substrate where the devices are to be bonded, and discrete deposits of bonding material may be on each of the device regions. For purposes of illustration, the bonding material deposits and device regions are shown in the figures as having planar dimensions corresponding to the devices which are disposed on them. However, it is understood that the shapes and dimensions of the bonding material deposits and device regions are not limited to the embodiments shown in the figures.

Any suitable bonding material may be on the device regions. The bonding material may include a polymeric adhesive (e.g., epoxy, polyimide, soft-baked polymeric deposits, bonding sheet material, or underfill material) or a metallic material. Preferred metallic materials include solder and diffusion bondable metals. The metallic bonding material may bond the devices to metal pads which provide electrical signals to the devices. For example, a metallic bonding material may include In, Sn, InSn, Zn, Au, Cu, or composite structures of metal such as a composite of 0.5 micron Sn/3 micron Au. If the devices are bonded to metal, some heating and/or pressure may be used to firmly bond the metal on the device regions to the devices. For example, in a typical diffusion process, InSn can be diffusion bonded to Au at about 180° C. or more for about 15 minutes or more. The bonding material may be deposited on the device substrate in any suitable manner. For example, a metallic bonding material may be deposited using a combination of photolithography techniques and a metal deposition process such as sputtering, electroplating, vacuum evaporation, or printing.

Preferably, the bonding material comprises a filled or unfilled polymeric adhesive material such as a thermoset or thermoplastic adhesive. Adhesive materials permit the devices to be bonded to the device substrates at lower temperatures (e.g., substantially ambient temperature). Illustratively, after a plurality of devices is disposed on a polymeric adhesive on the device regions, the adhesive can be soft-baked and/or cured at low temperatures so that the adhesion between the device regions and the devices is greater than the adhesion between the devices and the carrier substrate. The devices are retained on the device regions when the carrier substrate is pulled away and the devices are separated from the carrier substrate. In other embodiments, heating is not needed to bond devices to a device substrate.

If the bonding material comprises metal, the devices may include another metal (e.g., gold) to which the metal on the device regions bond. The device metal may be electrodes, especially electrodes for devices such as a VCSELs or PDs. When the device metal bonds to metal-coated device regions, electrical connections can then be formed between the devices and the device substrate.

The metal on the devices and the metal on the device regions can bond together using any suitable process including a diffusion bonding process. In a diffusion process, the diffusion bonds between the devices and the device regions are strong, and the carrier substrate can be separated from the devices, leaving the devices on the device substrate. Diffusion barrier metals such as Ti and Ni may be used in the devices to reduce the likelihood of undesired metal diffusion (e.g., into the active regions of the devices) when bonding the device. If the devices are metallized, metal may be coated on the devices at any suitable time. For example, the exposed surface of the devices can be coated with metal after the devices are lifted off from a formation substrate and/or after the devices are transferred to a carrier substrate.

In some cases, heating can be used to simultaneously increase the adhesion of the device array to the device substrate, while decreasing the adhesion of the device array to the carrier substrate. For example, if the bonding material on the carrier substrate is black wax or a thermoplastic adhesive, devices in a device plurality on the carrier substrate can be placed on device regions on a device substrate. Heat can be applied to the combination. During heating, the adhesion between the carrier and the devices becomes weak as the black wax becomes more fluid. Simultaneously, the adhesion between devices and the device substrate can increase if, for example, the bond formed between the devices and the device substrate is a diffusion bond. In other embodiments, if the carrier substrate is transparent (e.g., a quartz or glass substrate), a device plurality can be separated from the carrier substrate by selectively applying radiation (e.g., IR, UV) through the substrate to the device plurality. For instance, a UV-laser can be applied to the back side of a carrier substrate to selective areas of bonding material corresponding to the devices in the device plurality. The bonding material can decompose, thus releasing the devices from the carrier substrate and transferring the devices to the device substrate.

While a bonding material is preferably deposited on the device regions, a bonding material need not be included on the device regions. In some embodiments, the device regions on the device substrate may be free of a bonding material, and the bonding material may be selectively applied to the devices on the carrier substrate. The bonding material-coated devices can then be placed on a device substrate. In other embodiments, the devices may adhere to the device substrate via Van der Waals forces. To improve the reliability of the transfer by Van der Waals forces, it may be helpful to apply a surface treatment to the surface of the device substrate. For instance, a prebonding layer made from a molecular layer adsorption process, a Langmuir Blodjett process, or molecular layer deposition (MLD) may be helpful. However, when using Van der Waals forces to bond the devices, a bonding material or other material is preferably not needed to bond the devices to the device substrate.

In some embodiments, different device pluralities having different device types, can be placed on one device substrate using different carrier substrates. For example, a first carrier substrate can be used to place a first plurality of devices of a first type on a device substrate. Then, a second carrier substrate can be used to place a second plurality of devices of a second type on the device substrate. If heat is used to bond the devices to the device substrate, the device bonding temperatures are successively lower with each subsequently bonded device plurality. For instance, when diffusion bonding devices onto a device substrate, the device metal on successive device pluralities and the metal on the device regions on successive device substrates can be chosen so that the temperatures needed to bond the metals are successively lower for each subsequent device plurality bonding step. The processing temperatures need not be successively decreased in other embodiments. For example, in some embodiments, successive device pluralities can be bonded to a device substrate using substantially the same processing temperature for each device plurality. Some diffusion bonds, for example, are stable after formation. The additional heat applied for each successive device plurality does not affect the bond strength between the device substrate and the devices already bonded to the substrate. In another example, solder may be deposited on the device regions. The solder for subsequently bonded device pluralities can have lower reflow temperatures than the solder used for previously bonded devices pluralities. Using lower bonding temperatures for each successive device plurality can help prevent the earlier bonded device pluralities from unbonding due to, e.g., remelting of the formed bonds. In other embodiments, successively lower processing temperatures need not be used. For instance, a device plurality with different types of devices can be placed on solder deposits on the device regions. Then, heat can be applied to the entire substrate to bond all of the devices to the device substrate simultaneously.

As noted, the device pluralities are placed on and bonded to device region patterns two or more device substrates. Alternatively or additionally, the device pluralities can be placed on device region patterns on the same device substrate. The device substrate may comprise any suitable material including metals such as aluminum, semiconductors such as silicon, inorganic materials such as quartz and glass, and polymeric materials. The device substrates may optionally include communication lines such as circuitry (e.g., pads, lines, vias) and/or waveguides to provide communication channels for the devices placed on the devices substrate. Signals can pass through these communication lines, and to and from any device. In this regard, examples of device substrates include chips, optical circuit boards, electrical circuit boards, etc. The communication lines may be present before the devices are on the device substrate or after the devices are placed on the device substrate. In this regard, the device substrate may be a final substrate which is incorporated into a device assembly. However, as will be explained in more detail below, the device substrate may be removed prior to forming the intended device assembly.

When placing device pluralities in an array on a carrier substrate on different substrates (or even different parts of the same device substrate), the carrier substrate can be shifted in a planar direction (e.g., an x or y direction) by a distance "d" or any integer multiples (e.g., d×N, where N is an integer of one or more) thereof to align different device pluralities with device regions on different device substrates. For the array 50 shown in FIG. 3(e), the carrier substrate can be shifted a distance "d" nine times to respectively place nine different device pluralities labeled "a" to "i" on nine different device substrates (or parts of a device substrate). The distance "d" may be equal to the dimension of one of the devices (including the boundary trench region) in the array and/or may be equal to the pitch of devices in a device array. For example, the distance "d" may be substantially equal to the length or width of the device (including the boundary trench region). If the devices in an array have the same length and width, the pitch of the devices may be substantially equal to the device length and the device width. For example, if all of the devices in the array have a width of 30 microns (including the boundary trench region) and a length of 30 microns, the device pitch may also be 30 microns. The carrier substrate can be shifted a distance of 30 microns in an x or y direction with respect to the position of the carrier substrate when the previous device plurality was bonded. In another embodiment, if the devices in an array have a width of 30 microns and a length of 50 microns (the pitch of adjacent devices may also be 50 μm or 30 μm in this case), the carrier substrate can be shifted either 50 or 30 microns (or integer multiples thereof) to align the next device plurality with the device regions on the next device substrate.

After the first plurality of devices is placed on a device substrate, additional pluralities of devices can be placed on and then bonded to other device substrates. For example, with reference to FIGS. 3(i) and 3(k), a second device substrate 17(b) can be positioned so that a bonding material 19(b) and the device regions 18(b) on the second device substrate 17(b) are in the same positions as the bonding material 19(a) and device regions 18(a) on first device substrate 17(a) in the previous bonding step. The carrier substrate 14 is disposed above the second device substrate 17(b) and can be shifted another distance "d" from the previous carrier substrate 14 bonding position, and can then move towards the second device substrate 17(b) to bond the second plurality of device 16(b) to the bonding material 19(b) on the device regions 18(b).

After the second plurality of devices 16(b) is bonded to the second device substrate 17(b), a third plurality of devices 16(c) may be bonded to a third device substrate 17(c). Device regions 18(c) and the bonding material 19(c) thereon may be in the same position as the prior bonding material deposits 19(a), 19(b) and the previous device regions 18(a), 18(b). The carrier substrate 14 is disposed above the third device substrate 17(c) can be shifted another distance "d" from the previous carrier substrate 14 bonding position or a distance "2d" from the aligned position of the carrier substrate when the first plurality of devices 16(a) were bonded. Then, the carrier substrate 14 moves towards the third device substrate 17(c) to bond the third plurality of device 16(b) to the device regions. This process can be repeated, shifting the array in an x or y direction, until all of the device pluralities are bonded to their respective device substrates.

Forming device assemblies in this manner provides a number of advantages. For example, many devices can be manipulated together so they can be aligned in one step and placed on a device substrate in one step. Moreover, plural devices can be aligned together so that fewer alignment steps are needed to place a plurality of devices to a device substrate. For example, with reference to FIG. 3(e), instead of separately manipulating, aligning, and bonding eighty-one devices to nine device substrates, all eighty-one devices can be aligned and bonded to nine device substrates in nine aligning and bonding steps. Compared to some conventional processes, the number of aligning and bonding steps can be greatly reduced (e.g., from 81 aligning and bonding steps to 9). In some embodiments, a single device assembly (and consequently a device array) can include over one hundred or over one thousand devices. The time and labor savings when producing device assemblies with such large numbers of devices can be quite significant. Decreasing the alignment steps and the bonding steps when processing a device substrate can advantageously decrease the time needed to place devices on a device substrate and can increase the processing throughput.

In some embodiments, the devices in the array may be tested prior to being placed on the device substrates. For instance, after the devices are disposed on the carrier substrate, the devices in the array can be electrically tested by applying a test current to the devices. In some instances, it may be desirable to separately test small groups of devices to avoid potential excessive resistive heating during testing. By testing the devices prior to device placement, the placement of defective devices on device substrates can be avoided and yields can be maximized.

Defective devices can be located, preferably automatically with a testing apparatus. The data including locations of the defective devices can be input into a computer in a handling apparatus which manipulates the carrier substrate when the device pluralities are bonded to the device substrates. The handling apparatus can manipulate or shift the carrier substrate and devices so that the device pluralities with defective devices are skipped. Alternatively, the carrier substrate can be manipulated to selectively bond functional devices to device regions, while not bonding defective devices. For instance, a device array can be tested on a formation substrate to determine which devices in the array are defective. A bonding layer can then be formed on a carrier substrate in a pattern corresponding to the functional devices in the array (i.e., excluding the defective devices), and the functional devices can be transferred to the carrier substrate. After being transferred to the carrier substrate, device pluralities can be transferred to device substrates in the manner previously described. The device regions where the defective devices would have been bonded can be left open. A second carrier substrate with functional devices can be used to bond functional devices to the open device regions.

Any number of different devices may be bonded to a device substrate using embodiments of the invention. For example, in some embodiments, the different types of devices can be optical devices which are adapted to operate at different wavelengths. In another example, VCSELs, PDs, driver chips, amplifier chips, and other devices may be included on a single device substrate to form a hetero-integrated device assembly. One preferred method for forming such a device assembly can be described with reference to FIGS. 4(a) to 4(y).

FIGS. 4(a) and 4(b) show an array of devices 46(a) formed on a first formation substrate 43. Each device can have a dimension dx and a dimension dy (including the boundary trench region). Trenches are formed between each of the devices 46(a) so that lateral edges of the devices 46(a) are not in contact with each other. As shown in FIGS. 4(c) and 4(d), the devices 46(a) in the array are then transferred to a first carrier substrate 44(a), and are separated from the formation substrate 43. The first carrier substrate 44(a) is then aligned with regions on a second carrier substrate 44(b), and is then bonded to the device regions on the second carrier substrate 44(b). As shown in FIGS. 4(f) and 4(g), the devices 46(a) can be present in a new array on the second carrier substrate 44(b). The array of devices on the second carrier substrate 44(b) has five groups of devices, each group having a dimension Px and Py. The devices 46(a) on the second carrier substrate 44(b) can then be transferred to a device substrate 47 such as the one shown in FIGS. 4(h) and 4(i).

The device substrate 47 shown in FIGS. 4(h) and 4(i) has a first plurality of device regions 48(a) and a second plurality of device regions 48(b) respectively adapted to receive different device pluralities with different types of devices. A bonding material 49(a), 49(b) may be disposed on the device regions 48(a), 48(b). Although the device regions 48(a), 48(b) in this example are shown as in a somewhat regular arrangement with respect to each other, the first and second device regions 48(a), 48(b) may also appear to be irregular. For example, the plurality of second device regions 48(b) may be shifted an arbitrary distance from where they appear in FIG. 4(h) so that the device regions 48(a), 48(b) on the device substrate 47 appear to be arranged an an irregular arrangement.

As shown in FIG. 4(l), a first plurality of devices 46(a) on the second carrier 44(b) can be aligned with, and then bonded to the first plurality of device regions 48(a) on a device substrate 47. With reference to FIG. 4(l), after the devices separate from the second carrier substrate 44, the remaining devices on the second carrier substrate 44 can be bonded to other device substrates (or other parts of the same device substrate) having device regions in a pattern similar to the first plurality of device regions 48(a). For example, the carrier substrate 44(b) can be shifted a distance dx or dy for each successive device substrate. As shown in FIG. 4(k), after the devices 46(a) are bonded to the device substrate 47, the second plurality of device regions 48(b) on the device substrate 47 are free to receive subsequently placed devices of a different type than the devices in the first device plurality 46(a).

After the first device plurality is bonded to the device substrate, a second plurality of devices is bonded to the second plurality of device regions on the device substrate. FIGS. 4(m) and 4(n) show a second array of devices 46(b) on a second formation substrate 53. Each device 46(b) can include dimensions dx and dy (including boundary trench region). Trenches are formed between each of the devices 46(b) so that lateral edges of the devices 46(a) are not in contact with each other. As shown in FIGS. 4(o) and 4(p), the devices 46(b) in the second device array are then transferred to a third carrier substrate 54(a), and are separated from the formation substrate 53. As shown in FIG. 4(q), the third carrier substrate 54(a) is aligned with regions on a fourth carrier substrate 54(b), and the plurality of devices 46(b) are placed on regions of the fourth carrier substrate 54(b). As shown in FIGS. 4(s) and 4(t), the devices 46(b) are in a newly formed array. The devices are present in four groups on the fourth carrier substrate 54(b). Each group is in the form of a square and has a dimension Px and a dimension Py. A number of open regions 49 can be present on the fourth carrier substrate 54(b).

The devices 46(a) on the fourth carrier substrate 54(b) can then be transferred to the device substrate 47. The devices 46(b) on a fourth carrier substrate 54(b) may be aligned with the available device regions 48(b) on the device substrate 47 and then bonded to them via bonding material deposits 49(a), 49(b). Open regions 49 on the fourth carrier substrate 54(b) permit the second plurality of devices 46(b) to be bonded to the device substrate 74 without interference from the other devices 46(a) on the device substrate 47. After the devices 46(b) are disposed on the second plurality of device regions 48(b), the fourth carrier substrate 54(b) is separated from the devices 46(b). The resulting structure shown in FIG. 4(g) includes a device substrate 47 and a first plurality of devices 46(a) and a second plurality of devices 46(b). The devices 46(a), 46(b) in the first and second device pluralities can have different types of devices. For example, the first plurality of devices 46(a) may be photodetectors, while the second plurality of devices 46(b) may be VSCEL devices. In another example, the first plurality of devices 46(a) may include VCSELs operable at λ1 and the second plurality of devices 46(b) may include VCSELs operable at λ2.

On the first carrier substrate 44(a), many devices are left after devices are transferred to the second carrier substrate 44(b). The devices left on the first carrier substrate 44(a) can be transferred to yet another carrier substrate (not shown) to perform the same kind of operation as the second carrier substrate 44(b). Similarly, after transferring devices to from the third carrier substrate 54(a) to a fourth carrier substrate 54(b), many devices are left on the third carrier substrate 54(a). The devices left on the third carrier substrate 54(a) can be transferred to another carrier substrate (not shown) to perform the same operation as the fourth carrier substrate 54(b). These and other device transfer embodiments, become more and more important when the number of the different types of devices increases, especially from a standpoint of material savings and process efficiency. For example, if three types of different devices are integrated together in a device assembly, a number of different carrier substrates can be used to place these different types of devices on a device substrate.

In other embodiments, each device may comprise a combination of elements which can be placed on a single device region on the device substrate. Illustrative embodiments can be described with reference to FIGS. 5(a)–5(q). Specific details regarding the formation of the optical filters, waveguides, etc. shown in FIGS. 5(a)–5(q) can be found in U.S. patent application Ser. Nos. 09/295,431, 09/295,813, now U.S. Pat. No. 6,343,171 and Ser. No. 09/295,628, now U.S. Pat. No. 6,611,635, and need not be discussed in greater detail here.

In FIG. 5(a), an optoelectronic layer 64 including VCSELs (or PDs) 67 can be formed on a formation substrate 63. After forming the VCSELs 67, a waveguide layer 65 is deposited on the optoelectronic layer 64. Waveguide elements 68 are then formed from the waveguide layer 65 and optical filters 66 are formed on the waveguide elements 68 to form a plurality of optoelectronic devices 69. The optical filters 66 of the optoelectronic devices 69 are for filtering light of a wavelength of λ1. The optical filters 66 can be formed by using photolithography, laser ablation, molding, or any other suitable method. After the filters 66 are formed, trenches can be formed to separate the VCSELs 67 and the corresponding optoelectronic devices 69 from each other. Then, the optoelectronic devices 69 are bonded to an adhesive layer 72 on a first carrier substrate 71. The first carrier substrate 71 is then lifted to separate the optoelectronic devices 69 from the formation substrate 63. For example, the structure shown in FIG. 5(e) can be immersed in an etch bath to etch release layer portions (not shown) disposed under each of the VCSELs 67. As shown in FIG. 5(f), after etching, any physical connection between the formation substrate 63 and the VCSELs 67 can be severed so that the optoelectronic devices 69 can be separated from the formation substrate 63.

Optionally, optoelectronic devices 69 are transferred to other carrier substrates prior to being placed on a device substrate. For instance, as shown in FIG. 5(g), the optoelectronic devices 69 are bonded to an adhesive layer 74 on a second carrier substrate 73. Then, selected optoelectronic devices 69 within the array of optoelectronic devices on the second carrier substrate 73 are bonded to a discontinuous adhesive layer 77 on a third carrier substrate 76. As shown in FIG. 5(i), selected optoelectronic device devices 69 are disposed on the third carrier substrate 76 to form a new array of optoelectronic devices 69. The optoelectronic devices 69 can then be transferred to one or more device substrates in the manner previously described. For example, as shown in FIGS. 5(j) and 5(k), a plurality of optoelectronic devices 69 can be aligned with, and then bonded to a first plurality of bonding regions 95(a) disposed on a first plurality of device regions on a device substrate 96.

The optoelectronic devices 69 can be positioned to provide optical signals of a preselected wavelength (e.g., λ1) in first direction. Then, as shown in FIGS. 5(*l*) and 5(*m*), optoelectronic devices 70 may be transferred to a second plurality of bonding regions 95(*b*) disposed on a plurality of device regions on the device substrate 96. The optoelectronic devices 70 can be positioned to provide optical signals of a preselected wavelength (e.g., λ2) in a second direction.

After the optoelectronic devices 69, 70 are disposed on the device substrate 96, waveguides which can transport optical signals to and from the optoelectronic devices 69, 70 can be formed on the device substrate 96. As shown in FIG. 5(*n*), an underclad layer 101 can be formed directly on the device substrate 96, and a core layer 102 is formed on the underclad layer 101. Then, as shown in FIG. 5(*o*), an optional overclad layer 103 is formed on the core layer 101 after core patterns are formed. As shown in FIGS. 5(*n*) to 5(*q*), some disturbances in waveguide structures can exist near the device boundary regions. Such disturbances may be reduced by using vapor phase deposition methods to form core and clad layers. Examples of vapor deposition methods include evaporation polymerization methods, CVD, molecular beam deposition, (MBD) molecular layer deposition (MLD), etc.

The surfaces of the optoelectronic devices 69, 70 can be metallized. For instance, as shown in FIG. 5(*p*), to provide support for the clad and core layers during metallization, a temporary substrate 104 can be attached to a top surface of the upper clad layer 103 and the device substrate 96 can be separated from the formed assembly. Then, the bottom portions of the optoelectronic devices 69, 70 may be metallized in any suitable manner (e.g., electroplating, sputtering, etc.). After metallization, the temporary substrate 104 can be removed. If desired, the temporary substrate 104 is removed after the device assembly is joined to other substrates or layers. The formed device assembly is shown in FIG. 5(*q*), and includes optoelectronic devices 69, 70 which can provide wavelength MUX/DEMUX functions for different wavelengths of, e.g., λ1 and λ2. In the example shown in the FIG. 5(*q*), light propagates in different directions within the assembly. However, it is possible to position the optoelectronic devices 69, 70 so that light propagates in the same direction. In this case, optoelectronic devices 69, 70 are arranged in a cascade, which enables wavelength add/drop functions for the guided light waves. In other embodiments, the optoelectronic devices 69, 70 may include stacked components including photonic crystals. These stacked components can be used as filters.

Other methods which may be used to form the device assemblies can be described with reference to FIGS. 6(*a*) to 6(*h*). FIG. 6(*a*) shows a device substrate 127 including a number of conductive pads 128. The conductive pads 128 may have a bonding material such as solder or diffusion-bondable metal deposited on them. Then, one or more pluralities or devices 126 may be placed on the conductive pads in the manner previously described. After placing the devices 126 on the conductive pads 128, a cover material 121 such as a polymeric material may be deposited on the device substrate 127, and then cured. The polymeric material may be in the form of a laminated sheet or a liquid when deposited. As shown in FIG. 6(*d*), cover material 121 may be planarized using a chemical mechanical polishing process if desired. A number of communication lines (e.g., circuitry, waveguides, etc.), vias and additional pads 125 can be formed to provide communication paths for the devices 126. Additional layers including electrical, optical, and/or electro-optical devices or lines (not shown) may be built-up on the cover material if desired.

As shown in FIG. 6(*f*), the device substrate 127 may then be removed if it is not to be included in the formed assembly 129. If desired, the underside of the devices 126 in the assembly 129 may be metallized after the device substrate 127 is separated. The device assembly 129 may be bonded to other assemblies to form an optical, electronic, or optoelectronic apparatus. For example, as shown in FIG. 6(*f*), an optical substrate 130 including waveguides and optical filters may be joined to the assembly 129. In another example, as shown in FIG. 6(*g*), the optoelectronic assembly 129 may be joined to an electrical device such as an LSI chip 131. When joining, the device substrate 121 can be removed after stacking the device assembly 129 on the optical substrate 130 or the electrical device 131. Doing so improves the dimension stability during the joining process. It is also possible to use the electrical device 131 for the device substrate 127, which enables direct building-up of the assembly 129 on the electrical device 131. Similarly, it is also possible to use optical substrate 130 for the device substrate 127, which enables direct building-up of the assembly 129 on the optical substrate 130.

Referring in detail now to FIGS. 7–59 for additional embodiments of the present invention, and wherein similar parts of the invention are identified by like reference numerals, there is seen the formation substrate 43 having devices 46(*a*). An ELO process is performed on the formation substrate 43 including devices 46(*a*) to transfer the devices 46(*a*) to carrier substrate 44(*b*). Each of the devices 46(*a*) is supported by a tilting layer 198 connected to a release layer 200 which is secured to the formation substrate 43. The devices 46(*a*) were transferred to the carrier substrate 44(*b*) into a new array, more specifically a new array having five groups of devices, with each group having a dimension of Px and Py. The devices 46(*a*) on the carrier substrate 44(*b*) may then be tilted through tilting process 210 (described hereafter) which includes the transfer of devices 46(*a*) to intermediate substrate 44(*c*). From the intermediate substrate 44(*c*) the tilted devices 46(*a*) are transferred to device regions 48(*a*) on device substrate 47.

The device substrate 47 shown in FIGS. 11 and 12 has a first plurality of the device regions 48(*a*) and a second plurality of the device regions 48(*b*) respectively adapted to receive different device pluralities with different types of devices. As was seen for the device regions 48(*a*) and 48(*b*), on the device substrate 47 of FIGS. 4(*h*) and 4(*i*), the bonding material 49(*a*), 49(*b*) may be disposed on the device regions 48(*a*), 48(*b*). The device regions 48(*a*), 48(*b*) for this embodiment of the invention have slanted surfaces with respect to a horizontal surface 47s of the device substrate 47. The surfaces of the device regions 48(*a*) and 49(*b*) are slanted at an angle which is essentially the same angle that the devices 46(*a*) are tilted. The device regions 48(*a*) and 48(*b*) may be in a somewhat regular arrangement with respect to each other or the first and second device regions 48(*a*), 48(*b*) may be irregularly arranged, as previously indicated.

As was shown for the first plurality of devices 46(*a*) in FIG. 4(*j*), the first plurality of tilted devices 46(*a*) on the intermediate substrate 46(*c*) in FIG. 14 and FIG. 43 can be aligned with, and then bonded to the first plurality of device regions 48(*a*) on a device substrate 47. With reference to FIG. 16, after the devices 46(*a*) separate from the intermediate substrate 44(*c*), the remaining devices on the intermediate substrate 44(*c*) can be bonded to other device substrates (or other parts of the same device substrate) having device regions in a pattern similar to the first plurality of device regions 48(*a*). For example, as was previously indicated, the intermediate substrate 44(*c*) can be shifted a distance dx or dy (see FIG. 4(*b*)) for each successive device substrate. As shown in FIG. 17, after the devices 46(a) are bonded to the device substrate 47, the second plurality of device regions 48(b) on the device substrate 47 are unfilled and available to receive subsequently placed devices of a different type than the devices in the first device plurality 46(a).

After the plurality of first devices 46(a) are bonded to the device substrate 47, the second plurality of devices 46(b) is bonded to the second plurality of device regions 48(b) on the device substrate 47. FIGS. 18 and 19 show the second array of devices 46(b) on the second formation substrate 53. As previously indicated for the devices 46(b) in FIG. 4(m), each device 46(b) can include dimensions dx and dy (including boundary trench region). Trenches may be formed between each of the devices 46(b) in FIG. 18 so that lateral edges of the devices 46(b) are not in contact with each other. As shown in FIGS. 20 and 21, the devices 46(b) in the second device array may then be transferred to carrier substrate 49 through the ELO process. Each of the devices 46(b) is supported by a tilting layer (i.e., the tilting layer 198) connected to a release layer 200 (i.e., the release layer 200). The devices 46(b) were transferred to the carrier substrate 49 into a new array, more specifically a new array having four groups of devices, with each group having a dimension of Px and Py (as was seen in FIG. 4s). As was seen for devices 46(a) on the carrier substrate 44(b) of FIG. 10, the devices 46(b) on the carrier substrate 49 may subsequently be tilted through the tilting process 210 which includes the transfer of devices 46(b) to intermediate substrate 49(a). From the intermediate substrate 49(a), the devices 46(b) are subsequently transferred to the device regions 48(b) on device substrate 47. As shown in FIG. 23 and FIG. 45, the intermediate substrate 49(a) is aligned with regions 48(b) on the device substrate 47, and the plurality of devices 46(b) are placed on regions 48(b) of the device substrate 47. As shown in FIGS. 20 and 21, the devices 46(b) are in a newly formed array. As previously mentioned, the devices 46(b) are present in four groups on the carrier substrate 49. Each group is in the form of a square and has the dimension Px and a dimension Py. A number of open regions 49r are present on the carrier substrate 49.

The tilted devices 46(b) on the intermediate substrate 49(a) are transferred to the device substrate 47. The tilted devices 46(b) on the intermediate substrate 49(a) may be aligned with the available device regions 48(b) on the device substrate 47 and then bonded to them via bonding material deposits 49(b). Open regions 49r on the carrier substrate 49 permit the second plurality of devices 46(b) to be transferred to intermediate substrate 49(a) during the tilting process 210 in such a pattern or fashion in that the devices 46(a) may be transferred from the intermediate substrate 49(a) and be bonded to the device substrate 47 without interference from the other devices 46(a) on the device substrate 47. After the devices 46(b) are disposed on the second plurality of device regions 48(b), the intermediate substrate 49(a) is separated from the devices 46(b) as best shown in FIG. 25 and FIG. 46. The resulting structure shown in FIG. 25 includes the device substrate 47 and the first plurality of devices 46(a) and the second plurality of devices 46(b). The devices 46(a), 46(b) in the first and second device pluralities may be different types of devices. For example, the first plurality of devices 46(a) may be photodetectors, while the second plurality of devices 46(b) may be VSCEL devices. In another example, and as previously indicated, the first plurality of devices 46(a) may include VCSELs operable at λ1 and the second plurality of devices 46(b) may include VCSELs operable at λ2.

On the intermediate substrate 44(c) of FIG. 15, many devices may be left after devices are transferred to the device substrate 47. The devices left on the intermediate substrate 44(c) may be transferred to yet another device substrate (not shown) to perform the same kind of operation as the device substrate 47. Similarly, after transferring devices from the intermediate substrate 49(a) to the device substrate 47, many devices are left on the intermediate substrate 49(a). The devices left on the intermediate substrate 49(a) can be transferred to another device substrate (not shown) to perform the same operation as the device substrate 47. As previously mentioned, these and other device transfer embodiments, become more and more important when the number of the different types of devices increases, especially from a standpoint of material savings and process efficiency. For example, and as previously indicated, if three types of different devices are integrated together in a device assembly, a number of different carrier substrates can be used to place these different types of devices on a device substrate.

The process flow illustrated in FIGS. 7–26 and FIGS. 27–41 is the same as that illustrated in FIGS. 3(a)–5(g) with the exception of the tilting process 210 inserted before the step of device transfer to a real substrate (i.e., substrate 47). As previously indicated, for the embodiments of the invention in FIGS. 7–26, 42–46 devices 46(a) and 46(b) are separately transferred to different substrates (e.g., substrates 44(c) and 49(a)) for conducting the tilting process 210 (as exemplified in FIGS. 54–59 with a portion of the release layer being bent and tilted). As also previously indicated, for the embodiments of the invention illustrated in FIGS. 47–40, 47–53 devices 46(a) and 46(b) are transferred to the same substrate (e.g., substrate 44(c) for tilting). As previously indicated, the devices 46(a) and 46(b) may be, for example, filters, tunable filters, light modulators, optical switches, light-emitting devices, photodetectors, and so on. The embodiments of the present method are particularly useful for fabricating wavelength MUX/DEMUX, Add/Drop switch, optical transceiver, and so on, containing vertical light paths for WDM networking systems. Some examples of the beveled cut process and devices built on the beveled cut structures have been previously indicated and are described in Proc. SPIE Vol. 3952, Proc. of 50$^{th}$ ECTC, and in patent applications having the following application numbers: Ser. No. 09/295,431; Ser. No. 09/295,813, now U.S. Pat. No. 6,343,171; and Ser. No. 09/295,628, now U.S. Pat. 6,611,635, all fully incorporated herein by reference thereto.

In the embodiment of the invention in FIGS. 50–53, the tabs or layers 198 are etched or otherwise removed from the substrate 44(c) after the different types of devices 46(a) and 46(b) were removed and transferred off of the respective tabs or layers 198. Etching may be performed by any suitable plasma etching apparatus in combination with the Twin-Spot Interferometric Camera produced by The Thin Film Group of Instruments S. A./Horiba (Edison, N.J.). In FIGS. 42–53 the device regions 48(a) and 48(b) are generally normal or perpendicular to the substrate 47, more specifically normal with respect to the horizontal surface 47s of the substrate.

In the embodiment of the invention in FIGS. 7–25, 42–46, and 27–40, 47–53, the devices 46(a) and 46(b) may be tilted by any suitable process, such as any process or apparatus that may uplift or release the release layer 200 from a substrate (e.g., substrate 44(c)), or by employment of magnetic materials and fields, or by the microelectromechanical systems (MEMS) as described in an article entitled "Industry Adjusts to the MEMS Market" by R. Winn Harden from *OE Reports,* Number 188 (August 1999, SPIE), and fully incorporated herein by reference thereto. If magnetic materials are used for or in the tilting layer 198, the angle of tilting the thin-film devices 46(*a*) and 46(*b*) can be controlled by magnetic field strength during the placement. Furthermore, adhesion of the thin-film devices 46(*a*) and 46(*b*) on the catch-up surface or device regions 48(*a*) and 48(*b*) can be improved by applying magnetic field. FIGS. 54–59 illustrate the tilting process 210 employing MEMS for disengaging the release layer 200 from substrate 44(*c*) (or substrate 49(*a*)) to cause the tilting layer 198 associated with and supported by the release layer 200 to tilt the devices (e.g., devices 46(*a*) or 46(*b*)) supported thereby. In FIGS. 54–56, release layers 200 (for example, Cu) are formed on an intermediate substrate 44(*c*) (for example, Si). Tilting layers 198 for tilting thin-film devices are formed by any suitable method (e.g., a 5 $\mu$m to 50 $\mu$m layer of $SiO_x$ may be disposed on top of a 5 $\mu$m to 50 $\mu$m of Ni). On the tilting layers 198, thin-film devices 46(*a*) and 46(*b*) are placed. Examples for placement methods have been described in the previously mentioned articles. Then the release layers 200 are removed, uplifted or bent by MEMS, resulting in tilting of the tilting layers 198. In FIGS. 57–59, tilting layer 198 is formed partially. Devices 46(*a*) are placed on the tilting layer 198. The areas where thin-film devices 46(*b*) lodge or are disposed consist of non-tilting layer 198(*a*). This ensures the flatness of the thin-film devices 46(*b*). The non-tilting layer 198(*a*) may consist of any suitable material, such as a polymer or the like.

It is to be understood that this invention is not limited to those precise embodiments and modifications described in the specification. Modifications and variations can be made one skilled in the art without departing from the spirit and scope of the invention. Moreover, any one or more features of any embodiment of the invention may be combined with any one or more other features of any other embodiment of the invention, without departing from the scope of the invention.

What is claimed is:

1. A method for transferring a device from one substrate to another substrate comprising:

coupling a device to a generally horizontal surface of a first substrate;

tilting the device with respect to the generally horizontal surface of the first substrate; and transferring the tilted device from the first substrate to a second substrate, wherein said coupling comprises disposing a release layer on the generally horizontal surface of the first substrate; disposing at least one tilting layer on the release layer; and placing said device on the tilting layer.

2. The method of claim 1 wherein said tilting the device comprises releasing at least a portion of the release layer from the horizontal surface of the first substrate.

3. The method of claim 1 additionally comprising disposing a second type device on the tilting layer.

4. A method for transferring a device from one substrate to another substrate comprising:

coupling a device to a generally horizontal surface of a first substrate;

titling the device with respect to the generally horizontal surface of the first substrate; and transferring the tilted device from the first substrate to a second substrate, wherein said tilting is by a magnetic field application.

5. A method comprising:

forming a first and second plurality of devices on a formation substrate;

transferring the first plurality and the second plurality of devices to a carrier substrate;

tilting the first plurality and the second plurality of devices with respect to a horizontal surface of the carrier substrate;

placing the first plurality of devices on a first plurality of device regions on a first device substrate; and placing the second plurality of devices on a second plurality of device regions on a second device substrate.

6. The method of claim 5 further comprising:

bonding the first plurality of devices to the first plurality of device regions; and bonding the second plurality of devices to the second plurality of device regions.

7. The method of claim 5 further comprising:

bonding the first plurality of devices to the first plurality of device regions using a bonding material disposed on the first plurality of device regions; and bonding the second plurality of devices to the second plurality of device regions using a bonding material disposed on the second plurality of device regions.

8. The method of claim 5 further comprising, after forming the first and second plurality of devices on the formation substrate:

forming trenches to separate each of the devices in the first and second plurality from each other.

9. The method of claim 5 where the first and second pluralities of devices have the same pattern.

10. The method of claim 5 wherein the first and second pluralities of devices have the same pattern, and wherein at least one device in the first device plurality on the carrier substrate is disposed between at least two adjacent devices in the second device plurality.

11. The method of claim 5 further comprising, prior to transferring:

separating the first and second plurality of devices from the formation substrate using a lift-off process.

12. The method of claim 5 further comprising, prior to transferring:

separating the first and second plurality of devices from the formation substrate using an epitaxial lift-off process.

13. The method of claim 5 wherein forming the first and second pluralities of devices on the formation substrate comprises forming the first and second pluralities of devices on a release layer on the formation substrate.

14. The method of claim 5 wherein the first plurality of devices comprises at least one of a wavelength filter, a mirror, a hologram, a grating, a light-emitting film, a photodiode, a VCSEL, optical switch, photonic crystal, LD, photo detector, transceiver chip, IC, LSI, light modulator, tunable filter, wavelength switch and a thin film structure.

15. The method of claim 5 further comprising:

forming a capacitor embedded film using the first plurality of devices on the first device substrate.

16. The method of claim 5 wherein the carrier substrate is a first carrier substrate, and wherein the method further comprises:

providing a third plurality of devices and a fourth plurality of devices on a second carrier substrate;

tilting the third plurality and fourth plurality of devices with respect to a horizontal surface of the second carrier substrate;

placing the third plurality of devices on a third plurality of device regions on the first device substrate; and placing the fourth plurality of devices on a fourth plurality of device regions on the second device substrate, wherein the devices in the first plurality of devices and the devices in the third plurality of devices have different operational characteristics.

17. The method of claim 5 wherein the carrier substrate is a first carrier substrate, and wherein the method further comprises:

providing a third plurality of devices, a fourth plurality of devices, and open regions on a second carrier substrate;

tilting the third plurality and fourth plurality of devices with respect to a horizontal surface of the second carrier substrate;

placing the third plurality of tilted devices on a third plurality of device regions on the first device substrate so that devices already on the first device substrate are disposed in the open regions; and placing the fourth plurality of tilted devices on a fourth plurality of device regions on the second device substrate so that devices already on the second device substrate are disposed in the open regions.

18. The method of claim 5 further comprising:

bonding the first plurality of tilted devices to the first plurality of device regions using a first bonding material; and bonding the second plurality of tilted devices to the second plurality of device regions using a second bonding material, wherein the first and second bonding materials include at least one of a diffusion bondable metal and solder.

19. The method of claim 5 further comprising:

bonding the first and second tilted device pluralities to the device regions on the first and second device substrates using a first bonding material;

providing a third plurality of devices and a fourth plurality of devices on a second carrier substrate;

tilting the third plurality and fourth plurality of devices with respect to a horizontal surface of the second carrier substrate;

bonding the third plurality of tilted devices to a third plurality of device regions on the first device substrate using a second bonding material; and bonding the fourth plurality of tilted devices to a fourth plurality of device regions on the second device substrate using the second bonding material, wherein the first bonding material has a higher bonding temperature than the second bonding material.

20. The method of claim 5 wherein the first and second device pluralities comprise optoelectronic devices.

21. The method of claim 5 wherein the formation substrate is crystalline.

22. The method of claim 5 wherein the first and second device pluralities are disposed in a device array, and wherein the device array comprises at least two groups of devices, each device group comprises at least one device from the first plurality of devices and at least one device from the second plurality of devices.

23. The method of claim 5 wherein the first and second device pluralities are disposed in a device array, and wherein the device array comprises at least two groups of devices, each device group comprises at least one device from the first plurality of devices and at least one device from the second plurality of devices, and wherein the method further comprises:

aligning the first device plurality with the first plurality of device regions; and aligning the second device plurality with the second plurality of device regions, wherein aligning the second device plurality with the second plurality of device regions comprises shifting the carrier substrate a distance approximately equal to a dimension of a device in the array.

24. The method of claim 5, wherein the first and second device pluralities are disposed in a device array, and wherein the device array comprises at least two groups of devices, each device group comprises at least one device from the first plurality of devices and at least one device from the second plurality of devices, and wherein each device group has a dimension Px and Py, and wherein at least two adjacent device regions on the first device substrate are separated by a distance about equal to Px or Py.

25. The method of claim 5, wherein the devices in the first plurality of devices comprises VCSELs and photodetectors.

26. The method of claim 5, wherein devices within the first plurality of devices have different operational characteristics.

27. The method of claim 5, wherein placing the first plurality of devices on the first plurality of device regions comprises simultaneously placing the devices in the first plurality of devices on the first plurality of device regions; and wherein placing the second plurality of devices on the second plurality of device regions comprises simultaneously placing the devices in the second plurality of devices on the second plurality of device regions.

28. The method of claim 5 wherein the device regions on the first device substrate correspond to the locations of input and output terminals of a chip to be mounted to the first device substrate, and wherein the first and second plurality of devices comprise at least one of a photodetector, a photodetector amplifier, a VCSEL, and a VCSEL driver.

29. The method of claim 5 further comprising:

bonding a chip to the first device substrate, wherein the first plurality of device regions and the second plurality of device regions are at locations corresponding to input and output terminals of the chip.

30. The method of claim 5 further comprising:

bonding a chip to the first device substrate, wherein at least some devices in the first plurality of devices are not disposed directly under an input or an output terminal of the chip disposed on the device assembly.

31. The method of claim 5 further comprising, after placing the first and second device pluralities on the first and second device substrates:

depositing a cover layer over the first and second device pluralities to embed the first and second device pluralities to form first and second device assemblies.

32. The method of claim 5 wherein at least two devices in the first and second device pluralities are operational at different radiation wavelengths.

33. The method of claim 5 further comprising:

forming a first plurality of waveguides on the first device substrate and forming a second plurality of waveguides on the second device substrate, wherein the waveguides communicate the devices in the first and second device pluralities.

34. The method of claim 5 wherein the first plurality of devices and the second plurality of devices include optical filters, wherein at least one optical filter includes a plurality of dielectric films or photonic crystals.

35. The method of claim 5 wherein the first plurality of devices and the second plurality of devices include a filter formed on an angled surface of a waveguide element.

36. The method of claim 5:

wherein the first and second device substrates comprise electrical circuitry.

37. The method of claim 36 wherein the first device assembly is a polymer smart pixel.

38. The method of claim 36 wherein the second device assembly is an interface chip layer.

39. The method of claim 5 further comprising:

depositing a polymeric cover layer on the first device substrate over the first device plurality; and planarizing the cover layer.

40. The method of claim 5 further comprising:

depositing a polymeric cover layer on the first device substrate over the first device plurality; and removing the first device substrate from the first device plurality.

41. The method of claim 5 further comprising:

mounting a chip on the first device substrate.

42. The method of claim 5 further comprising:

forming a waveguide on the first device substrate using a vapor deposition process.

43. The method of claim 5 further comprising, after placing the first plurality of devices on the first device substrate:

forming a first device assembly including the first plurality of devices and the first device substrate, wherein the first device assembly comprises at least one of an LSI chip, IC chip, optical circuitry, CSP or MCM.

44. The method of claim 5 further comprising, after placing the first plurality of devices on the first device substrate:

building up multiple layers on the first device substrate.

45. The method of claim 5 further comprising:

forming optical waveguides on the first device substrate.

46. The method of claim 5 further comprising mounting a chip on the first device substrate, wherein the device regions on the first device substrate correspond to the locations of input and output terminals of the chip mounted on the first device substrate.

47. The method of claim 5, wherein the first and second device substrates comprise at least one of an LSI chip, optical circuitry, CSP or MCM.

48. The method of claim 5 wherein said tilting is by a magnetic field application.

49. A method for forming an apparatus, the method comprising:

forming a first device assembly using the method of claim 5;

forming a second device assembly; and forming an apparatus comprising the first and second device assemblies.

50. The method of claim 49 wherein forming the apparatus comprises laminating the first and second device assemblies to each other.

51. The method of claim 49 wherein the second device assembly is a multichip module or a chip scale package.

52. The method of claim 49 wherein the second device assembly is formed on the first device assembly using a build-up process.

53. A method for placing device pluralities on device substrates, the method comprising:

providing an array of devices on a carrier substrate having a generally horizontal surface, wherein the array comprises multiple device pluralities having devices in predetermined patterns;

tilting the device pluralities with respect to the generally horizontal surface of the carrier substrate; and respectively placing the tilted device pluralities on device substrates having device regions in predetermined patterns corresponding to the predetermined patterns of the device pluralities.

54. The method of claim 53 further comprising:

bonding the tilted device pluralities to device regions on each of the device substrates using a bonding material.

55. The method of claim 53 further comprising, prior to placing:

respectively aligning the tilted device pluralities with the device regions on the respective device substrates, wherein each respective alignment comprises shifting the carrier substrate a distance approximately equal to N×d, wherein d is approximately equal to a dimension of a device in the array or a pitch of the devices in the array, and wherein N is an integer of at least one.

56. The method of claim 53 wherein the array of devices includes groups of devices, wherein each group includes at least one device from each of the tilted device pluralities.

57. The method of claim 53 wherein the array comprises multiple device groups, each device group has dimensions Px and Py, and wherein adjacent device regions on the device substrates are separated by a distance Px or Py.

58. The method of claim 53 wherein the devices in each of the tilted device pluralities have the same pattern.

59. The method of claim 53 further comprising, prior to providing:

forming the array of devices on a formation substrate.

60. The method of claim 53 further comprising, prior to providing:

forming the array of devices on a formation substrate, wherein the formation substrate comprises a semiconductor.

61. The method of claim 53 wherein the array of devices includes groups of devices, and each group includes at least one device from each of the tilted device pluralities; and the device groups have a pitch in the array, wherein the device group pitch is equal to the pitch of the device regions each of the device substrates.

62. The method of claim 53 further comprising:

testing the array of devices for defective devices; and not placing defective devices on the device substrates.

63. The method of claim 53 wherein the patterns formed by the device regions on each of the device substrates and the patterns formed by the devices in each of the tilted device pluralities are the same.

64. The method of claim 53 wherein said tilting is by a magnetic field application.

65. A method for placing device pluralities on device substrates, the method comprising:

providing an array of devices on a carrier substrate having a generally horizontal surface, wherein the array comprises multiple device pluralities having devices in predetermined patterns;

tilting the device pluralities with respect to the generally horizontal surface of the carrier substrate; and respectively placing the device pluralities on predetermined patterns of device regions corresponding to the predetermined patterns of the device pluralities.

66. The method of claim 65 wherein the predetermined patterns of device regions are respectively disposed on different device substrates.

67. The method of claim 65 wherein the predetermined patterns of device regions are on the same device substrate.

* * * * *